United States Patent [19]

Wikstrom et al.

[11] Patent Number: 5,182,473

[45] Date of Patent: Jan. 26, 1993

[54] EMITTER EMITTER LOGIC (EEL) AND EMITTER COLLECTOR DOTTED LOGIC (ECDL) FAMILIES

[75] Inventors: Jan A. Wikstrom; Mark S. Birrittella; David Kiefer, all of Chippewa Falls; Stephen B. Smetana, Eau Claire; Vernon W. Swanson, Chippewa Falls, all of Wis.

[73] Assignee: Cray Research, Inc., Chippewa Falls, Wis.

[21] Appl. No.: 826,214

[22] Filed: Jan. 22, 1992

Related U.S. Application Data

[63] Continuation-in-part of Ser. No. 560,134, Jul. 31, 1990, abandoned.

[51] Int. Cl.$^5$ .............................................. H03K 19/08
[52] U.S. Cl. ..................................... 307/454; 307/446; 307/448; 307/450
[58] Field of Search ............... 307/446, 454, 455, 450, 307/448

[56] References Cited

U.S. PATENT DOCUMENTS

| | | | |
|---|---|---|---|
| 3,448,288 | 6/1969 | Allmark | 307/446 |
| 4,112,314 | 9/1978 | Gani et al. | 307/446 |
| 4,423,339 | 12/1983 | Seelbach et al. | 307/464 |
| 4,598,213 | 7/1986 | Marley et al. | |
| 4,641,047 | 2/1987 | Birrittella | |
| 4,663,543 | 5/1987 | Sitch | 307/450 |
| 4,680,486 | 7/1987 | Price et al. | 307/446 |
| 4,703,203 | 10/1987 | Gallup et al. | 307/454 |
| 4,724,342 | 2/1988 | Sato et al. | 307/450 |
| 4,725,743 | 2/1988 | Anderson | 307/450 |
| 4,755,695 | 7/1988 | Suzuki | 307/448 |
| 4,798,979 | 1/1989 | Lee et al. | 307/450 |
| 4,801,826 | 1/1989 | Cornelissen | 307/482 |
| 4,831,284 | 5/1989 | Anderson et al. | 307/450 |
| 4,833,349 | 5/1989 | Liu et al. | 307/448 |
| 4,906,871 | 3/1990 | Iida | 307/443 |
| 4,922,135 | 5/1990 | Mollier et al. | 307/450 |
| 4,931,669 | 6/1990 | Higashisaka | 307/448 |
| 4,937,474 | 6/1990 | Sitch | 307/448 |
| 4,940,908 | 7/1990 | Tran | 307/443 |
| 4,943,740 | 7/1990 | Gulczynski | 307/454 |
| 4,945,258 | 7/1990 | Picard et al. | 307/270 |
| 4,965,863 | 10/1990 | Cray | 307/450 |
| 4,968,904 | 11/1990 | Yamashita et al. | 307/475 |

OTHER PUBLICATIONS

Hodges & Jackson, *Analysis and Design of Digital Integrated Circuits*, 422–427 (1988) (2nd Ed.).

*Primary Examiner*—Janice A. Howell
*Assistant Examiner*—Scott A. Ouellette
*Attorney, Agent, or Firm*—Merchant, Gould, Smith, Edell, Welter & Schmidt

[57] ABSTRACT

Logic unit cells are disclosed, consisting of an array of high speed logic gates, the outputs of which are wired together and coupled to a low power driver. High speed and switching rates are achieved by using very fast logic gates which have no gain and make use of a wired logic function in order to effect two levels of logic without adding the propagation delay through another logic gate. These arrays of logic gates are coupled to drivers which restore logic levels and provide the necessary power for driving interconnect capacitances while consuming and dissipating a minimum of power in the process. Another logic circuit discloses an array of logic gates as inputs to another logic gate, the individual gates consisting of gallium arsenide components and having drivers built into the output stage of each gate.

36 Claims, 14 Drawing Sheets

EMITTER EMITTER LOGIC (EEL) AND EMITTER COLLECTOR DOTTED LOGIC (ECDL) FAMILIES

This is a continuation-in-part of application Ser. No. 07/560,134, filed Jul. 31, 1990, now abandoned.

FIELD OF THE INVENTION

The present invention relates to logic gates for applications requiring high data rates, circuitry for driving these logic gates, and gallium arsenide (GaAs) implementations of these logic gates.

BACKGROUND OF THE INVENTION

When designing computer systems which require high data rates, such as supercomputers developed by Cray Research, Inc., the assignee of the present invention, the design of the individual logic gates is of importance in optimizing the performance and speed of the system. The logic circuits must have high switching rates and short propagation delay times in order to increase the speed of the system. While maintaining a short propagation delay, the logic circuits must also be designed so that they do not consume a high amount of power which may generate excess heat and adversely affect the performance of the transistors. Also, among other design considerations, the logic circuits must have a minimum of components in order to increase the packing density and fit more logic gates onto a particular integrated circuit chip.

In attempting to increase the speed or clock rate of a system in order to achieve high data rates, the propagation delays within the components of the system are of primary importance. One must ensure that the propagation delays within the logic gates and drivers or other circuits are of short enough duration so that a signal within any part of the system has adequate time to reach its destination within a given clock cycle. One method of increasing the speed of a system, and thus the number of operations per second which may be performed, is by decreasing the propagation delays within the logic gates and the circuitry which drives the gates.

Emitter Coupled Logic (ECL) has typically been the logic used for high speed applications, since, in silicon (Si) technology, it has demonstrated the shortest propagation delay times. ECL achieves high switching rates and short propagation delays due to the non-saturating characteristics of the logic. By avoiding the saturation region, the transistors within the logic circuit do not accumulate as much charge and, consequently, the storage times are decreased. The switching of states in the ECL gate is accomplished by the current steering properties of a basic differential amplifier.

Motorola introduced Emitter Coupled Logic, known as MECL for Motorola's Emitter Coupled Logic, in 1962. Two popular versions of MECL with the short propagation delay times are MECL 10K and MECL 10KH, introduced in 1971 and 1981 respectively. A more recent version is MECL 100K, which is faster than MECL 10K and MECL 10KH and has a more stable transfer characteristic.

MECL 10K uses a basic differential amplifier, one side of which is electrically connected to a temperature and voltage bias network. The other half of the differential amplifier consists of bipolar junction transistors connected in parallel, the inputs of the gate applied to the bases of the transistors. The outputs of the gate are emitter followers connected to the collectors of the differential amplifier which provides for two outputs, the OR and NOR functions. The OR output is derived from the collector of the transistor connected to the bias network and the NOR output is taken from the node consisting of the collectors of the input transistors. The emitter follower outputs provide both level shifting so that the outputs are compatible with MECL 10K input levels and a low output impedance which is useful for a high fan-out capability or driving transmission lines.

The current steering properties of the differential amplifier provide the means for switching the state of the logic circuit without using the saturation region of the transistors. When the logic gate is in a particular state, nearly all of the current in the differential amplifier is driven through one side of the amplifier, and the transistor in that side operates in the active region. A change in the input voltage levels to the gate, which will switch the state of the logic gate, alters the voltage difference across the differential amplifier so that the transistor which had previously been in the active region turns off, and a transistor on the other side of the differential amplifier turns on. In this manner, current is diverted from one side of the differential amplifier to the other as the gate switches states. It is this type of current steering in the differential amplifier which changes the state and, therefore, the output voltage levels of the gate. Since the transistors in ECL gates do not enter the saturation region and accumulate excess charge, the transistors turn off faster than in logic which utilizes the saturation region for switching of states. The current in the differential amplifier, therefore, rapidly switches from one side of the amplifier to the other. This contributes to short propagation delay times. With decreased storage times, and fast turn off times of the transistors, as a result of the non-saturating properties of the logic, MECL 10K achieves a propagation delay of approximately 2 nanoseconds.

MECL 10KH is a slight variation of the MECL 10K logic gate. It contains a different bias network and, instead of using a resistor coupled to the emitters of the differential amplifier, it uses a transistor as a constant current source to the differential amplifier. With these changes, as well as advances in processing, the MECL 10KH logic gate has a propagation delay of approximately 1 nanosecond.

The reference voltage supplied by the voltage bias network to the differentially connected transistors is not completely independent of temperature in the MECL 10K and MECL 10KH gates. Changes in temperature can cause changes in both the reference voltage and the output voltage levels. Also, variations in the supply voltage can affect the reference voltage. MECL 100K gates have additional circuitry which provides for improvements over MECL 10K and MECL 10KH. The additional circuitry causes the MECL 100K gate to be almost completely independent of variations in temperature and supply voltage, which results in a very stable transfer characteristic. In addition to these improvements, MECL 100K is slightly faster than MECL 10KH, and it has a propagation delay of approximately 0.75 nanoseconds.

MECL logic gates are designed to drive transmission lines. The emitter followers provide a low output impedance and current sourcing capability required to drive a twisted pair line outside of the integrated circuit chip on which the MECL circuit resides.

Even though MECL has been the popular logic used in systems requiring high data rates, the speed of MECL is reaching its limits, based in part upon the limitations of Si technology. Also, due to its high power dissipation, MECL is difficult to implement in large-scale (LSI) integrated circuit packages.

One method of overcoming the limitations due to the physical characteristics of Si is the use of gallium arsenide (GaAs). The electron mobility is six to seven times greater in GaAs than in Si. The use of GaAs enables one to design logic gates with lower power without sacrificing speed.

The present invention introduces new logic families, one of which is Emitter Collector Dotted Logic (ECDL).

Another new logic family introduced by the present invention is Emitter Emitter Logic (EEL).

ECDL and EEL logic gates use fewer components than MECL gates which results in a higher packing density on the integrated circuit chip. Also, these new logic families improve upon the power dissipation and propagation delays of MECL.

EEL and ECDL make use of novel high speed transient and current switch drivers to drive signals between groups of logic gates and outside of an integrated circuit chip.

The present invention also introduces Source Drain Dotted Logic (SDDL), which is an implementation of ECDL with a transient driver in GaAs. This utilizes the favorable characteristics of GaAs for the production of logic gates with much lower power while maintaining the same speed.

Another new logic family introduced by the present invention is Source FET Logic (SFL), which uses enhancement mode and depletion mode GaAs MESFETs.

SUMMARY OF THE INVENTION

The present invention solves the shortcomings of the related art described above and other shortcomings of the related art which will become apparent to those skilled in the art upon reading and understanding the present specification.

The present invention involves high speed logic gates and circuitry for driving signals between groups of gates and outside of an integrated circuit chip. As will become apparent in the specification, a complete logic unit cell consists of a two level array of logic gates along with a driver for amplification and the restoration of logic levels between unit cells.

The first logic family, Emitter Collector Dotted Logic (ECDL), uses bipolar transistors coupled in parallel with the logic inputs applied to the bases of these transistors. The emitters of these input transistors form an AND node in negative logic, at which the voltage changes rapidly in response to input voltage changes. ECDL gates may be wire-ORed together which, therefore, provides two levels of logic with an extremely fast switching speed.

Transient Driver "C" is typically used with ECDL as an amplifier for charging and discharging interconnect capacitances. Transient Driver "C" uses a novel method of generating an error voltage between an internal reference node and an output node in order to drive an active pull-down network. By using an error voltage, the pull-down circuitry is only turned when it is needed, in which case a large initial error voltage causes the pull-down circuitry to sink substantial amounts of current, rapidly discharging interconnect capacitances. Power is saved by turning the pull-down network off when it is not needed.

Transient Driver "B" is another type of amplifier which may be used for driving signals between logic unit cells. As with Transient Driver "C", Transient Driver "B" uses an active pull-down network at its output stage. The active pull-down, which is only turned on when needed, is an efficient and fast means for discharging interconnect capacitances.

The Programmable Current Switch Driver uses an output stage consisting of bipolar junction transistors coupled in parallel to form a basic differential amplifier. There are three current sources and three pairs of driving transistors available for use in the output stage of the driver. By connecting only the current sources and pairs of transistors needed when the entire driver circuit is fabricated, power is saved. The Programmable Current Switch Driver has much versatility due to the many ways in which the output can be configured in order to achieve different power levels.

The present invention also describes Source Drain Dotted Logic, which is an implementation of ECDL in gallium arsenide (GaAs), using depletion mode MESFETs and enhancement mode MESFETs. This is a straight translation of the silicon version of ECDL, in which bipolar junction transistors are used, into GaAs. The characteristics of GaAs at the atomic level result in much lower power of SDDL.

A GaAs driver is also described in the specification, and this would typically be used with SDDL as an amplifier between logic unit cells. The GaAs driver has two stages; the first stage uses a differential amplifier as the input, and additional circuitry in the first stage generates four signals which are used to drive a second stage. The second stage basically consists of transistors connected to form two push-pull type drivers, which are used to drive true and complementary outputs. The GaAs driver also has a novel self-clamping feature in the first stage which will be fully described in the specification.

The second logic family which is described in the specification is Emitter Emitter Logic (EEL), which looks similar to ECDL with the input transistors "turned around", so that in EEL the logic inputs are applied to the emitters of an array of bipolar junction transistors. The collectors of the input transistors form an AND node in positive logic. EEL gates may wire-ORed together in positive logic. The wired-OR capability allows two levels of logic to be constructed without adding the full propagation delay through another logic gate.

The two logic families, ECDL and EEL, including SDDL, the implementation of ECDL in GaAs, are designed to switch states very fast. Also, since the logic gates provide no gain, which actually increases the speed of the gates, they are used with drivers of the type outlined above. The combination of an array of logic gates connected to a high speed driver, both of which are part of the present invention, forms a fast logic unit cell with much drive capability and an efficient use of power.

A third logic family, Source FET Logic (SFL), uses depletion mode and enhancement modem GaAs MESFETs. SFL gates use push-pull type drivers at the outputs of the gates, and, therefore, SFL does not require driver circuits of the type used with ECDL and EEL. The characteristics of GaAs provide SFL with a high speed and low power dissipation.

BRIEF DESCRIPTION OF THE DRAWINGS

In the drawings where like numerals refer to like components.

DETAILED DESCRIPTION OF THE PREFERRED EMBODIMENT

In the following detailed description of the preferred embodiment, reference is made to the accompanying drawings which form a part hereof and in which is shown by way of illustration a specific embodiment in which the invention may be practiced. This embodiment is described in sufficient detail to enable those skilled in the art to practice the invention, and it is to be understood that other embodiments may be utilized and that structural or logical changes may be made without departing from the scope of the present invention. The following detailed description is, therefore, not to be taken in a limiting sense, and the scope of the present invention is defined by the appended claims.

EMITTER COLLECTOR DOTTED LOGIC (ECDL)

Figure 1A:
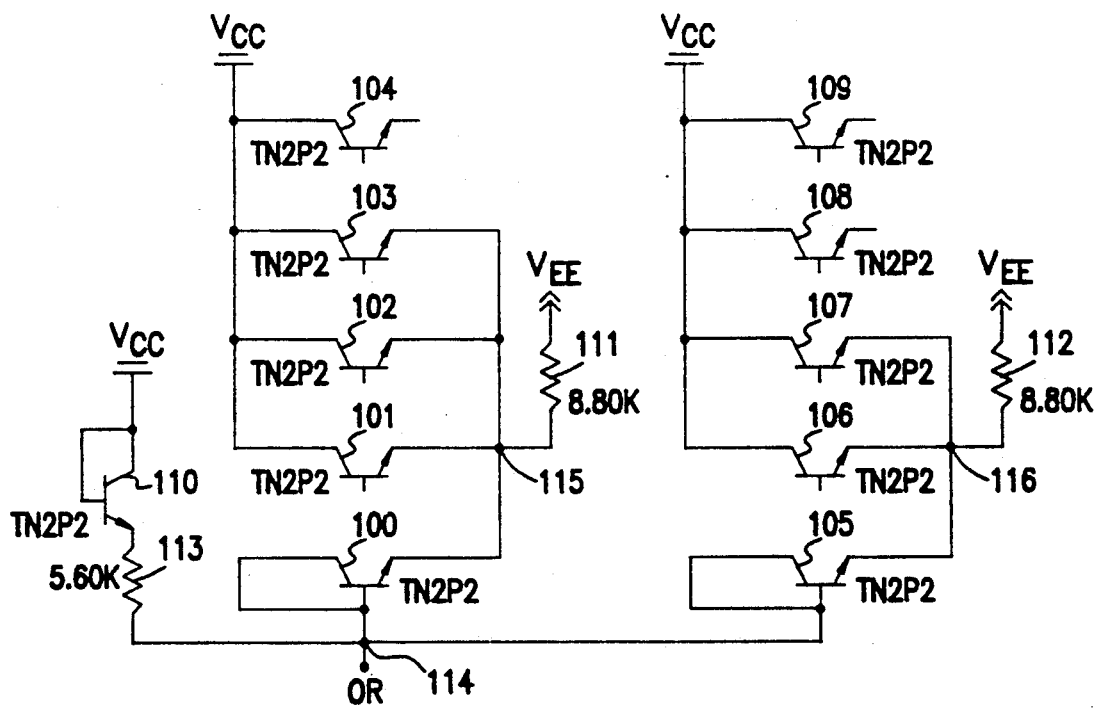
FIG. 1A is a schematic diagram of a two level Emitter Collector Dotted Logic array in a sum-of-products configuration.
Figure 2:
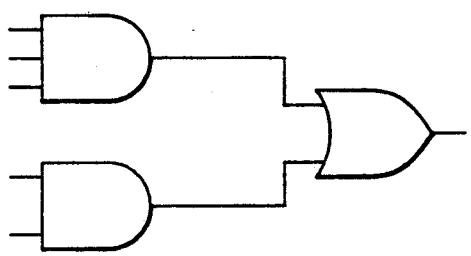
FIG. 2 is a gate level diagram of the circuit of FIG. 1.
Figure 3:
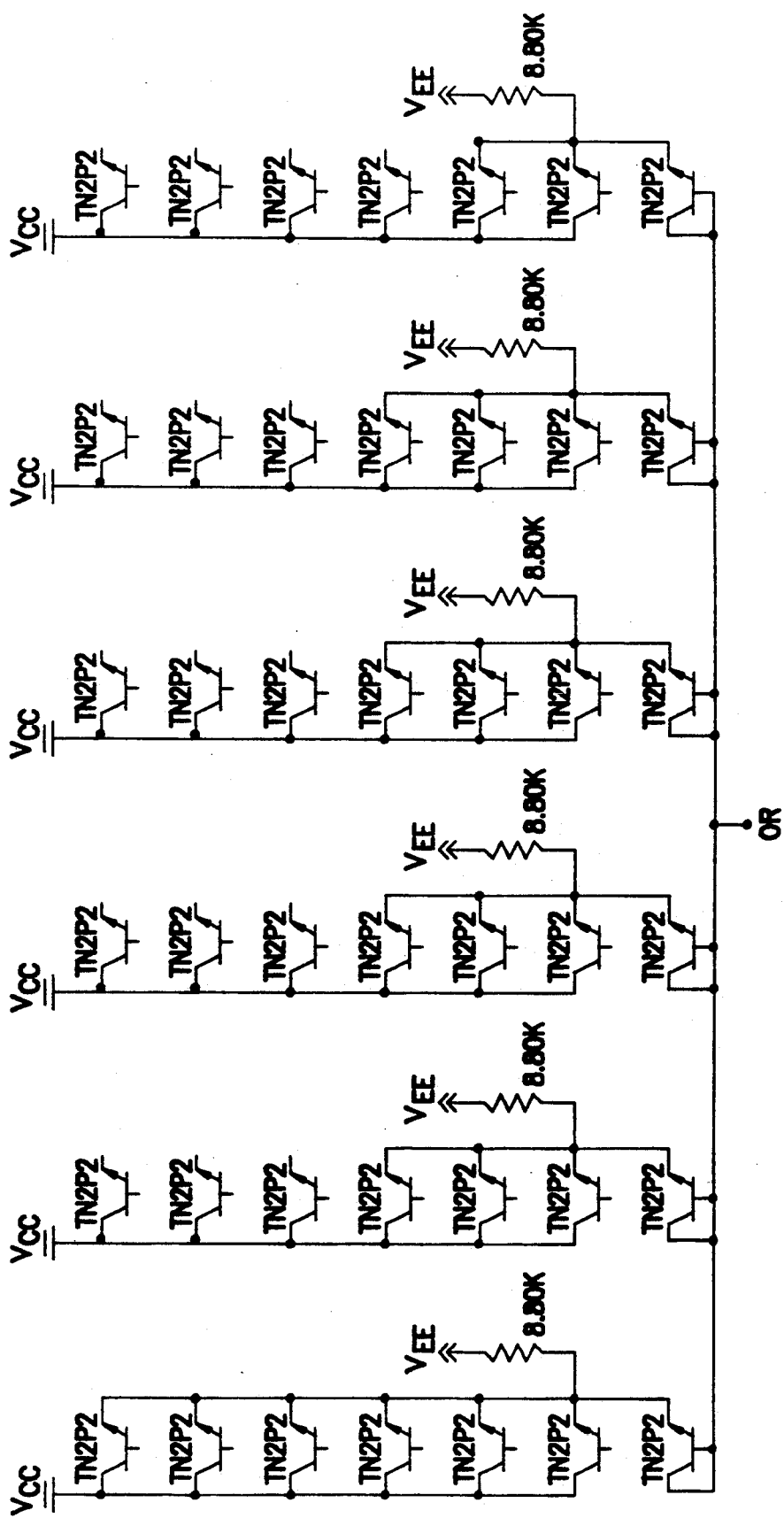
FIG. 3 is a schematic diagram of a two level Emitter Collector Dotted Logic array in a sum-of-products configuration, showing the maximum number of gates and inputs per gate for this particular implementation.

FIG. 1A shows a two level Emitter Collector Dotted Logic (ECDL) array in a sum-of-products configuration, and FIG. 2 is the corresponding gate level diagram of this array. Transistors 100-104 and resistor 111 form one ECDL AND gate and transistors 105-109 along with resistor 112 form another ECDL AND gate. These two gates are wire-ORed at node 114 to form a second level of logic. In the implementation shown, the fan-in of the AND gates is limited to six inputs and a maximum of six AND gates may be wire-ORed together. One skilled in the art will recognize that different fan-in values may be achieved without departing from the scope of the invention. FIG. 3 shows a complete ECDL array with the maximum number of gates and inputs per gate. The designer may choose the number of inputs to use of each AND gate and, as shown in both FIGS. 1 and 3, the emitters of the unused input transistors are left unconnected when the array is fabricated.

The ECDL AND gate operates in negative logic with input levels of −0.9 volts and −1.5 volts and a supply of voltage VEE of −3.5 volts. In analyzing the operation of the AND gate, consider first the case of all the inputs at the bases of transistors 101-103 being a logic 1, which is −1.5 volts. The voltage at node 115 will follow the inputs and rise or fall rapidly with changes in the input voltage levels. With all of the inputs at −1.5 volts, the voltage at node 115 will be approximately one base-emitter voltage drop, which is 0.8 volts, down from the inputs. Therefore, the voltage at node 115 will be −2.3 volts.

As known to one skilled in the art, transistor 100 is a diode-connected transistor, and, when connected in this manner, the transistor functions as a diode with the advantage of switching much faster than a diode. With node 115 at −2.3 volts, the diode-connected transistor 100 will conduct and pull down the voltage at node 114, so that node 114 will be one base-emitter voltage drop above node 115. Therefore, the voltage at node 114, which is the output of the AND gate, will be −1.5 volts. As shown above, with all of the inputs equal to a logic 1, which is −1.5 volts, the output will also be equal to −1.5 volts or a logic 1.

Next, consider the case of an input, the base of transistor 101 for example, rising to a logic 0, which is − 0.9 volts, while the other inputs remain at logic 1, which is −1.5 volts. Since node 115 is one base-emitter drop down from the base of transistor 101, it will follow the input at the base of transistor 101 and rise up to −1.7 volts. The bases of transistors 102 and 103 will still be at −1.5 volts, so that, with node 115 equal to −1.7 volts, the base-emitter voltages of transistors 102 and 103 will only be equal to 0.2 volts. Therefore, the rise in voltage at node 115 will turn off transistors 102 and 103. Again, the voltage at node 114 will be one base-emitter drop above the voltage at node 115 due to the diode-connected transistor 100. The voltage at the output, node 114, will be −0.9 volts, which is a logic 0.

As one can see, the output will only be a logic 1 when all of the inputs are a logic 1. If any input rises to −0.9 volts, which is a logic 0, then the output will be a logic 0. This constitutes an AND gate.

The combined transistor 110 and resistor 113 is a pull-up device connected to wired-OR node 114. When the outputs of all of the AND gates are at the logic 0, which is −0.9 volts, the voltage at the AND nodes 115 and 116 will also be a high voltage. The diode-connected transistors 100 and 105 will conduct very little current and resistor 113 will pull up the voltage at node 114 and maintain it at a high level. Transistor 110 acts as a level shifter and will also source current in order to charge capacitances connected to the wired-OR node 114 when it is in the high state of a logic 0.

Now, if the voltage at the output of any of the AND gates drops to a logic 1, the corresponding diode-connected transistor of that gate will begin to carry current. For example, if the voltage at node 115 decreases due to a low voltages at the bases of the input transistors 101-103, diode-connected transistor 100 will start drawing more current from node 114. Since resistor 113 is of a lower value than resistor 111, and can thus carry more current, the voltage at node 114 will be pulled down to a low voltage, which is a logic 1. In the logic 1 state, this AND gate will sink current through resistor 111 and diode-connected transistor 100, so that any capacitances connected to the output node 114 will be discharged, maintaining a low voltage necessary for a logic 1.

As shown above, if any of the AND gates produces a low voltage output (logic 1), the voltage at node 114 will be pulled down, so that a logic 1 is maintained at the output. The voltage at node 114 will only be high (logic 0) when all of the AND gates produce a high voltage output, which prevents the diode-connected transistors 100 and 105 from carrying substantial current and causes the voltage at node 114 to be pulled up by resistor 113. In this manner, node 114 constitutes the wired-OR function.

Figure 1B:
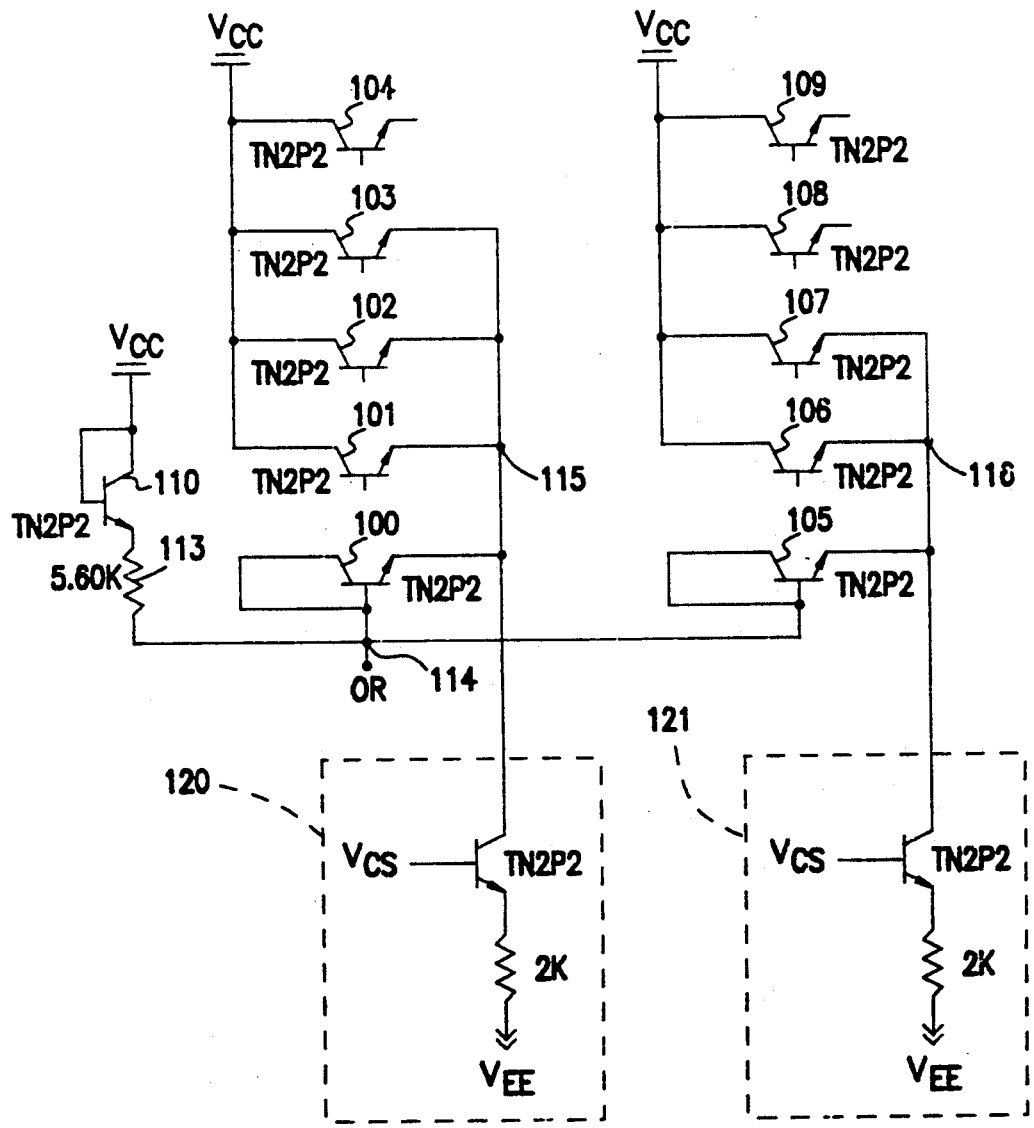
FIG. 1B is a schematic diagram of a preferred embodiment of a two level Emitter Collector Dotted Logic Array in a sum-of-products configuration using active current sources.

FIG. 1B shows a preferred embodiment of ECDL, which uses active current sources 120 and 121 instead of the passive current sources shown in FIG. 1A. The active current sources each comprise a transistor, the emitter of which is coupled through a resistor to a supply voltage VEE. A reference voltage VCS at the base of the transistor provides for biasing. Other embodiments of active current sources, such as current mirrors, will function with ECDL without departing from the scope of the invention. The active current sources 120 and 121 sink current from nodes 115 and 116 respectively. The active current sources operate essentially independent of temperature and thus provide for a more stable and reliable circuitry for sinking current when compared with the passive current sources.

This logic has much versatility. As shown in FIG. 3, each logic array, which consists of six input AND gates with the outputs connected to form a six input wired-OR gate, would be fabricated as a complete unit. The designer can select as many of the six inputs to the AND gates as needed. During fabrication, the emitters of the unused input transistors would be left unconnected.

There are other advantages of this logic, such as a high input impedance which is provided by the bases of the input transistors. Also, this two stage ECDL switches in 40-60 picoseconds, which is only 20-30 picoseconds per gate. Considering the high speed of the two level ECDL array, a typical application of this logic would be in supercomputers, such as the type developed by Cray Research, Inc., the assignee of the present invention. The high speed of this logic is partly due to the characteristics of the voltage changes at the AND node, for example, node 115. The voltage at this node begins to change as soon as the input voltage is changed. This causes the output to very closely follow the input, so that the logic switches rapidly.

ECDL does not, however, provide any gain. In fact, there is approximately a 200 millivolt loss through the gate. The inputs receive 600 millivolts, and 400 millivolts is delivered to the output. The lack of gain helps to increase the speed and it also requires, though, that a driver be used between logic unit cells to drive the metal connected to whichever gates are driven by this cell. A complete logic unit cell actually consists of a maximum of six ECDL AND gates, the outputs of which are wire-ORed together, and a high speed driver.

TRANSIENT DRIVER "C"

Figure 4:
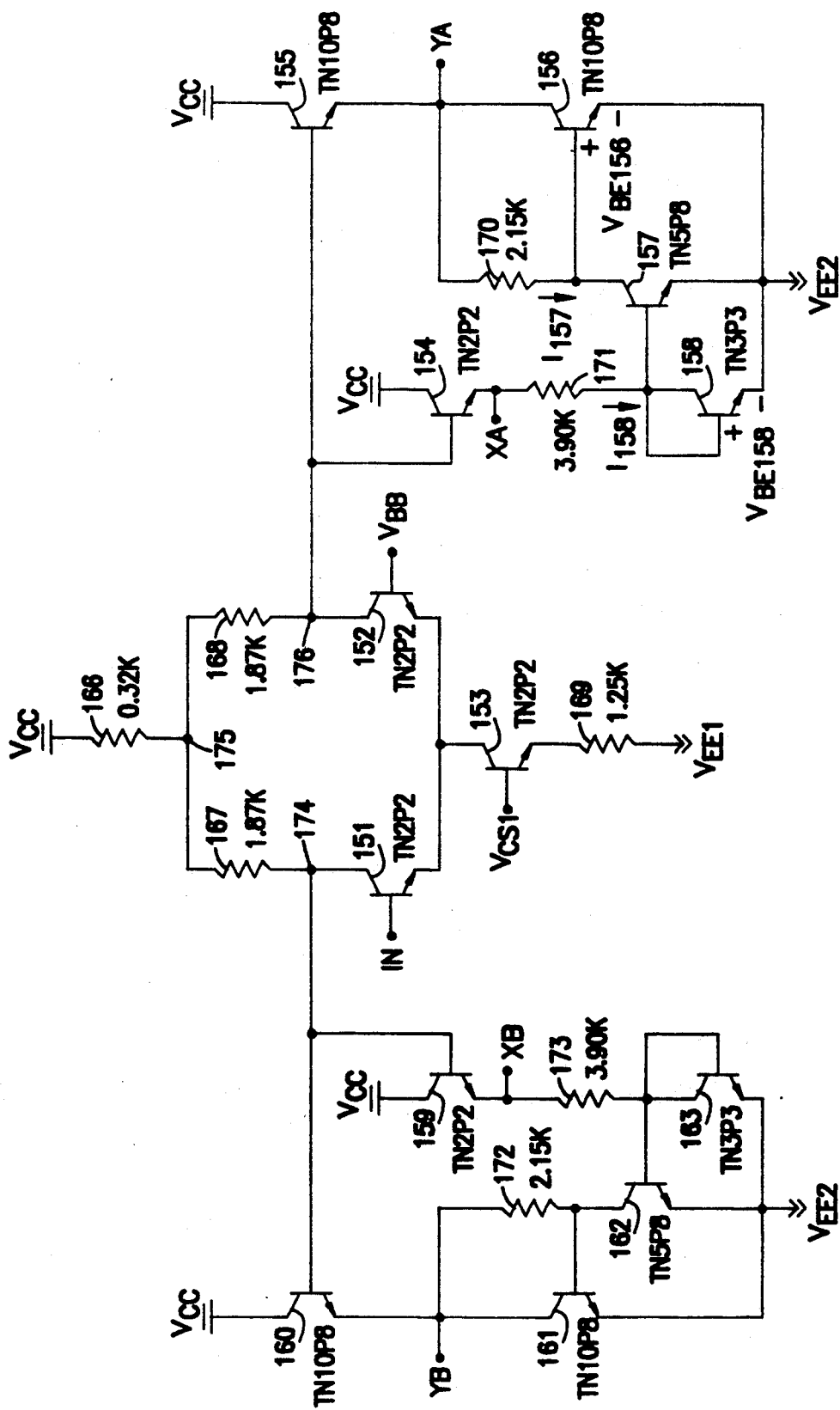
FIG. 4 is a schematic diagram of Transient Driver "C".

FIG. 4 shows a one stage driver, which will be referred to as Transient Driver "C". This one stage driver is the basis for other versions of Transient Driver "C", including a faster two stage version which is used in the ECDL unit cell.

The output a logic gate is connected to the IN node and compared to the reference voltage VBB. The output node YA is the true output, which follows the input, and node YB is the complement of the voltage at the IN node.

As is well known to those skilled in the art, the configuration of transistors 151 and 152 along with resistors 166-168 is a basic differential amplifier supplied by transistor 153, which acts as a current source.

Consider first the static case of a constant voltage at the IN node. The voltage levels received at the IN node are the logic levels of the gate to which this amplifier is connected. In the case of ECDL, the logic levels are $-0.9$ volts and $-1.5$ volts. If the voltage at the IN node is equal to the high level of $-0.9$ volts, transistor 151 will carry nearly all of the current drawn by transistor 153. The subsequent voltage drop across resistors 166 and 167 as a result of the current drawn by transistor 151 will cause the voltage at node 174 to decrease to $-0.7$ volts. By simple voltage division, the voltage at node 175 will be approximately $-0.1$ volts. Since transistor 152 conducts almost zero current, and there is a high resistance looking into the bases of transistors 154 and 155, there will be a negligible voltage drop across resistor 168 and the voltage at node 176 will also be approximately $-0.1$ volts. Therefore, the voltage at the true output node YA will be one base-emitter voltage drop down from the voltage at node 176, or $-0.9$ volts.

The high output level is thus restored at the true output node YA. And, the emitter follower transistor 155 provides for a low output impedance and the current sourcing capability to maintain node YA at the high level.

As previously stated, with the voltage at the IN node equal to $-0.9$ volts, the voltage at node 174 will be $-0.7$ volts. The voltage at the complement output node YB will thus be equal to the low logic level of $-1.5$ volts, since it is one base-emitter voltage drop down from the voltage at node 174.

Even though the above analysis uses the voltage levels of ECDL, this driver may operate with different input and output voltage levels. Resistor 166 is used to control the high output level and resistors 167 and 168, which have an equal value, are primarily used to control the low output level.

Next, when analyzing the dynamic operation of the driver as the voltage at the IN node switches levels, the novel feature of the driver which contributes to its high speed and low power will become apparent.

First, it is important to recognize that transistors 156 and 161 are pull-down devices for the output nodes YA and YB respectively. Transistors 157 and 158 form a current mirror and, assuming that their emitter areas are equal, since they have the same base-emitter voltage, their collector currents are equal. Likewise, transistors 162 and 163 form another current mirror. These current mirrors are used in driving the pull-down devices, transistors 156 and 161, which in turn discharge capacitive loads connected to the outputs.

The nodes XA and XB act as reference points. The voltage at node XA, for example, will follow the voltage at the IN node. Since the XA node, unlike the YA node, is an internal node and is not loaded down by any of the interconnect capacitances between drivers and gates, its voltage level will change quickly in response to input voltage changes. Thus, the voltage level at node XA will change more quickly than the voltage at node YA. This will produce an error voltage which is the difference between the voltages at nodes XA and YA. The error voltage will drive the base of pull-down transistor 156. While the capacitances connected to node YA are discharged, the voltage at node YA will drop until it is equal to the low logic level. In this condition, with the voltages at nodes XA and YA being equal, the error voltage will be zero and transistor 156 will barely be conducting due to a lower biasing voltage. The error voltage between nodes YB and XB controls transistor 161 in the same manner.

This may also be illustrated mathematically. In the equations, R170 and R171 represent the value of resistors 170 and 171 respectively, and V(XA) and V(YA) represent the voltages at nodes XA and YA respectively. The controlling factor of the collector current of transistor 156, which is used for pulling down the voltage at the output node YA, is the base-emitter voltage VBE156 of transistor 156. If the base currents are neglected, since they are negligible compared to collector currents, then VBE156 may be written as:

$$VBE156 = V(YA) - (I157)(R170) - VEE2 \quad [1]$$

And, since transistors 157 and 158 form a current mirror, I157 will be equal to I158, which may be written as:

$$I158 = \frac{V(XA) - VBE158 - VEE2}{R171} \quad [2]$$

Now, if I158, being equal to I157, is substituted into equation [1], and R170 is equal to R171, then VBE156 may be written as:

$$VBE156 = V(YA) - V(XA) + VBE158 \quad [3]$$

Since VBE158 is relatively constant, VBE156 is primarily controlled by the error voltage of V(YA) − V(XA) as shown by equation [3]. When the voltage at the IN node drops, V(XA) will decrease quickly, producing the error voltage of V(YA) − V(XA). The error voltage provides the base drive to transistor 156 necessary to sink current and discharge capacitances connected to node YA. When the voltage at node YA reaches its final value, the error voltage will be zero and transistor 156 will return to the idle state.

Equation [3] is simplified due to the assumption that resistors 170 and 171 are equal. If resistors 170 and 171 are not equal, VBE156 will have a slight dependence on the supply voltage VEE2 as a result of some additional terms which would be in equation [3]. This could also be deduced by the equations. Even if resistors 170 and 171 are not equal, the primary factor controlling the base-emitter voltage VBE156 of transistor 156 is the error voltage between output node YA and internal reference node XA. Therefore, different values for resistors 170 and 171 may be used without departing from the scope of the invention. The same applies to resistors 172 and 173 on the complement side of the driver.

By providing internal reference nodes (XA and XB) not loaded by interconnect capacitances, a clever method of generating an error voltage and turning on the pull-down network only when it is needed has been developed. When the pull-down network is not used, the pull-down transistors are barely conducting, which leaves the pull-down transistors in a state such that they dissipate very little power and may be quickly turned on to sink considerable amounts of current when needed. This is advantageous in saving power while maintaining a driver with a high speed. These drivers are thus more efficient than the emitter follower outputs of Emitter Coupled Logic.

Figure 5:
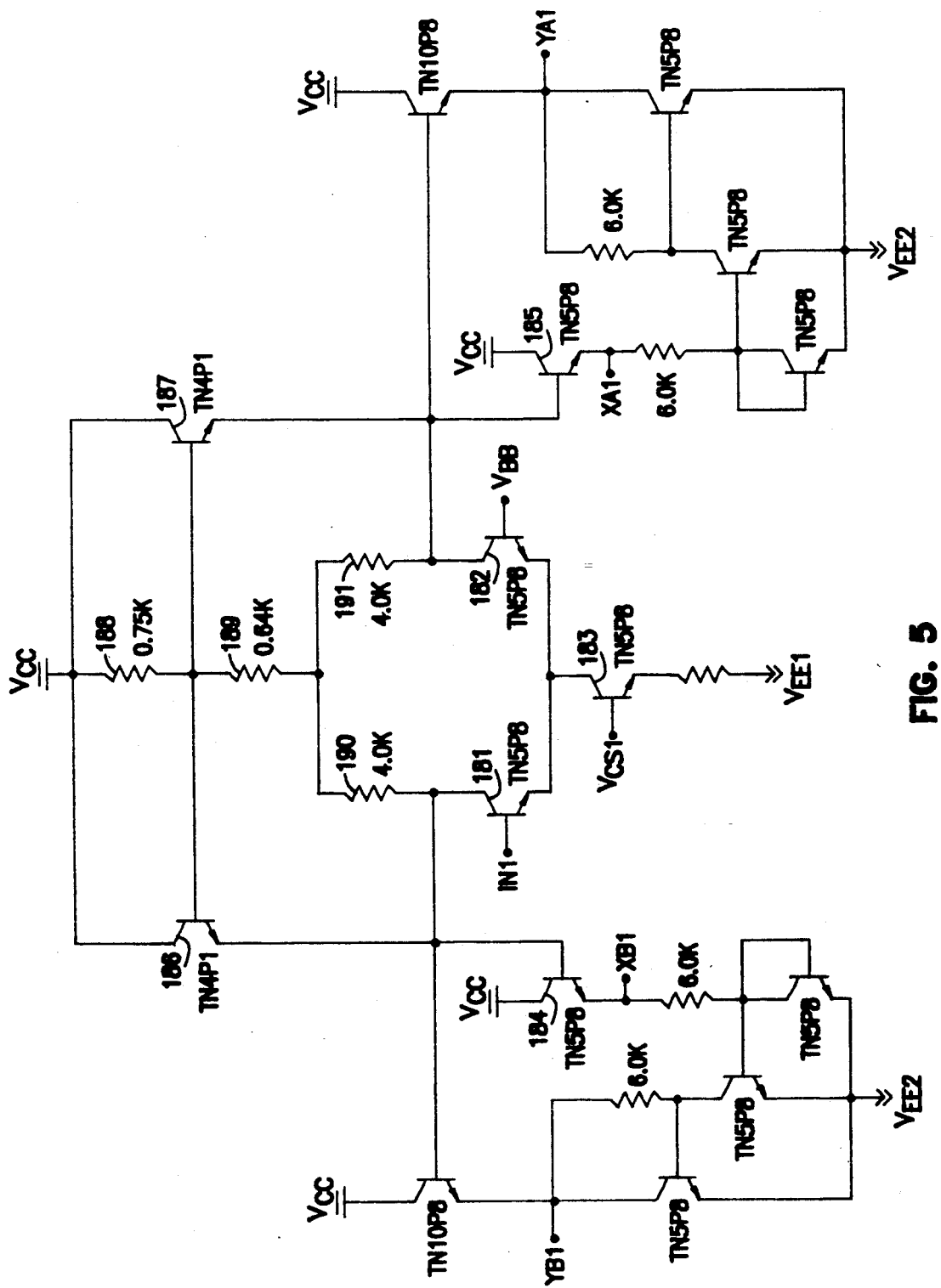
FIG. 5 is a schematic diagram of a modified version of Transient Driver "C".

FIG. 5 shows a modified version of Transient Driver "C". In terms of the structure of the circuitry, there are two differences between this modified driver and the driver depicted in FIG. 4. First, transistors 181-183, which form the differential input and current source, are fabricated with longer emitters so that they are able to drive more current than the corresponding transistors 151-153 in FIG. 4. Transistors 184 and 185 used to form the reference nodes XA and XB are also fabricated with the ability to source larger amounts of current than transistors 154 and 159. Secondly, transistors 186 and 187 have been added to the circuit. And resistors 188 and 189 perform the function of resistor 166 in FIG. 4. The additional transistors 186 and 187 are used to clamp the current drawn by the current source, transistor 183, for the differential amplifier, transistors 181 and 182.

Since the driving capability of transistors 181-185 has been increased, more current is available for charging external capacitances and causing the voltage at the reference nodes XA1 and XB1 to rise and fall more quickly. This will result in a faster turn on of the pull-down network. Therefore, this driver has an overall faster response and shorter propagation delay.

The additional current, though, must be clamped at an upper limit to avoid driving too much current through resistors 189-191 of the differential amplifier. By limiting the amount of current through resistors 189-191, the logic levels are maintained. Transistors 186 and 187 perform this function. For example, when sufficient current is drawn by transistors 181 and 183, the voltage drop across resistors 189 and 190 will turn on transistor 186. Current shunted through transistor 186 will bypass resistors 189 and 190. Therefore, the current drawn by transistor 186 will limit the amount of current through resistors 189 and 190.

Figure 6:
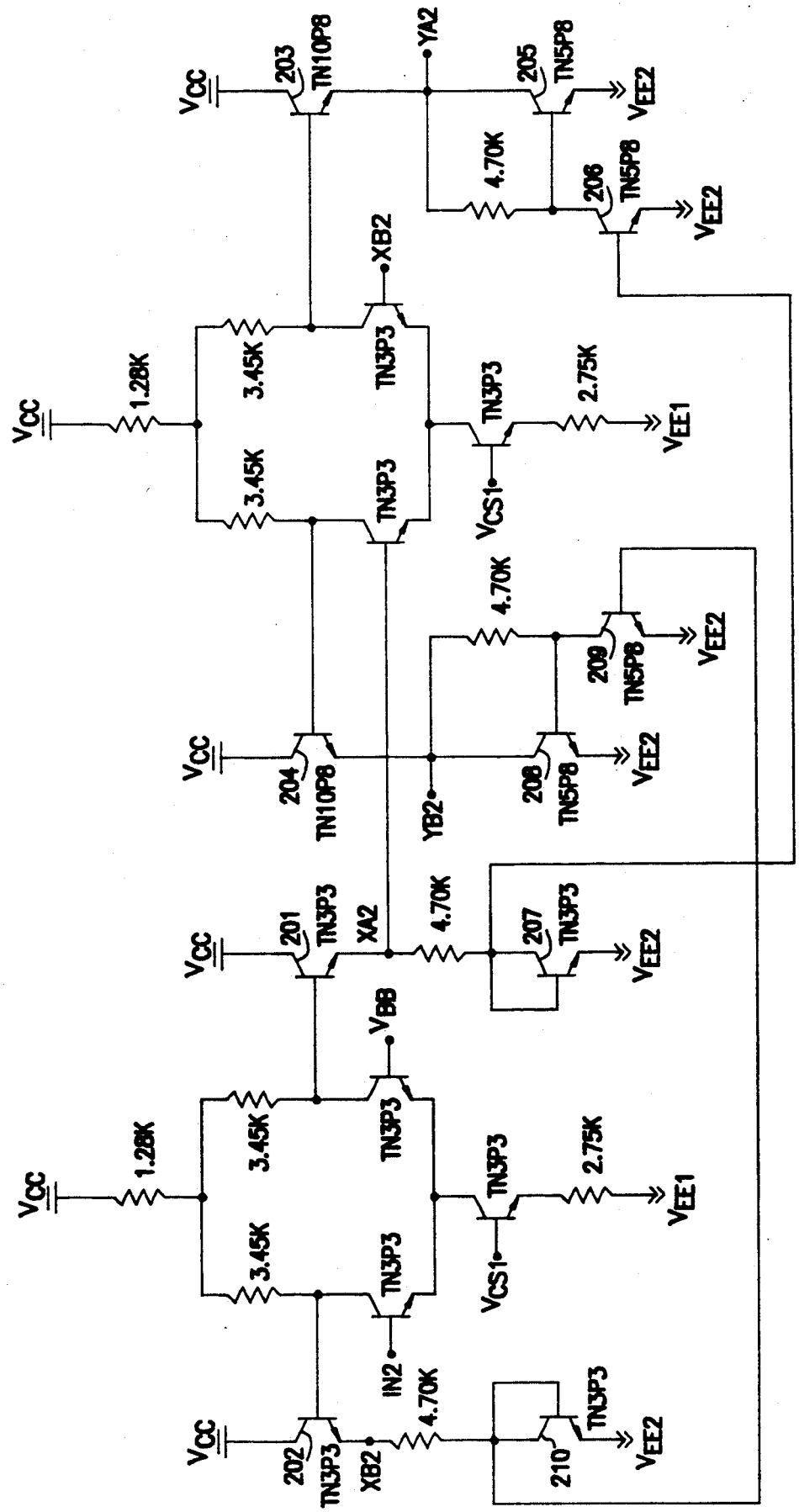
FIG. 6 is a schematic diagram of a two stage version of Transient Driver "C".

FIG. 6 shows a two stage version of Transient Driver "C". The two stage version uses two basic differential amplifiers with the voltage error generating circuitry divided between the two stages.

At the first stage, the input voltage at node IN2 is compared to the reference voltage VBB. The internal reference nodes XA2 and XB2 again change quickly in terms of voltage level in conjunction with voltage changes at the IN2 node. The outputs from the first stage, reference nodes XA2 and XB2, are fed into a second stage. The second stage drives the output nodes YA2 and YB2.

The conceptual operation of this circuit is identical to the single stage driver of FIG. 4. An error voltage is generated between nodes YA2 and XA2, as in the single stage version, which drives the active pull-down transistor 205. In the same manner, the error voltage between nodes YB2 and XB2 drives transistor 208. The same type of current mirrors, transistors 206 and 207 on the true side and transistors 209 and 210 on the complement side are used in conjunction with the pull-down transistors 205 and 208 respectively.

Whereas in the single stage version (FIG. 4), transistors 201 and 202 used to generate the reference nodes XA2 and XB2, and transistors 203 and 204 used as active pull-up devices, were connected by the bases to the same node, these devices have now been divided between two stages.

The two stage version has the advantage of further isolating the reference nodes XA2 and XB2 from the output nodes YA2 and YB2. Also, it has a faster operation and lower propagation delay than the single stage Transient Driver "C".

Figure 7:
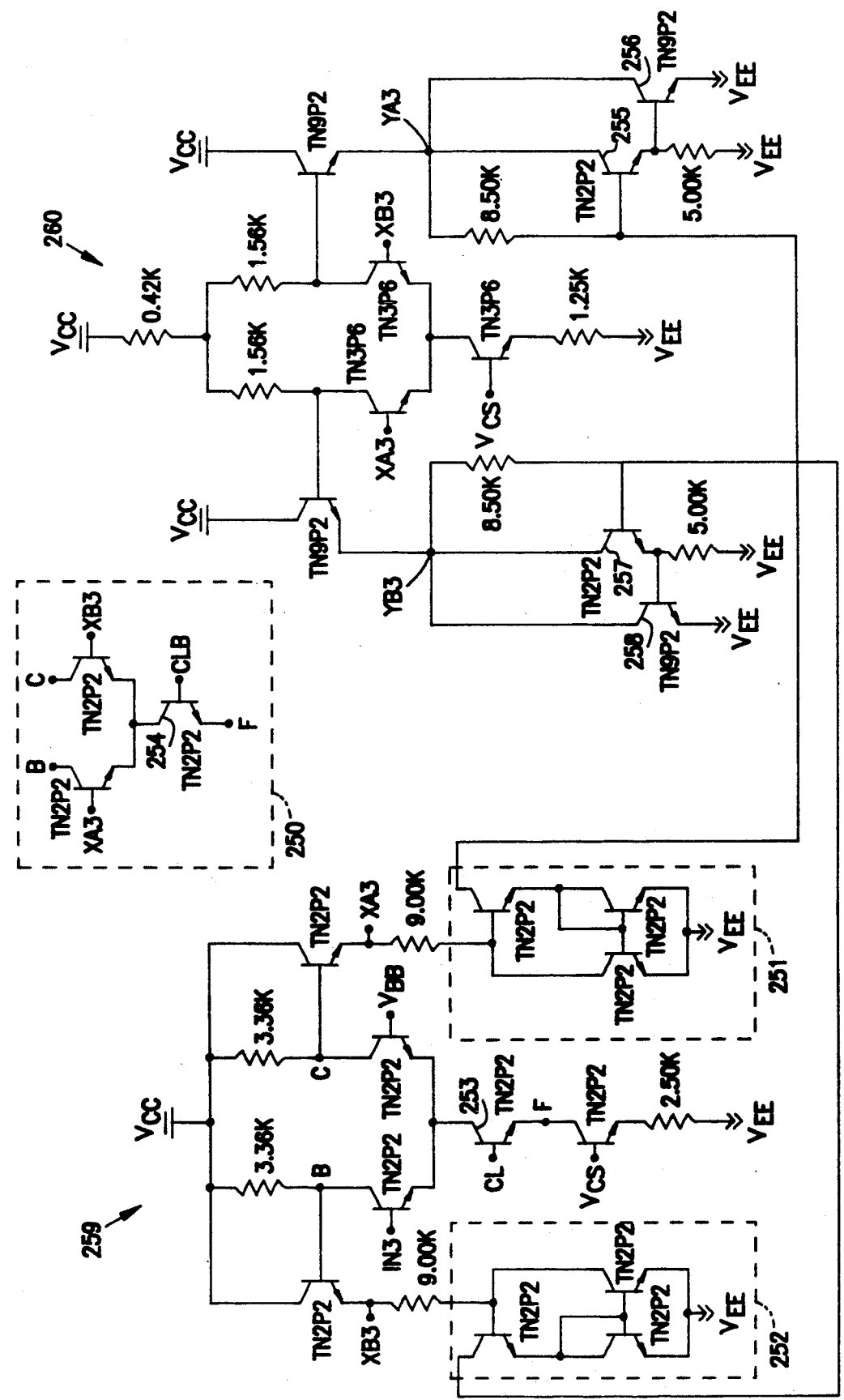
FIG. 7 is a schematic diagram of a two stage Darlington version of Transient Driver "C".

FIG. 7 shows a two stage Darlington version of Transient Driver "C". This circuit is developed by making modifications to the two stage driver of FIG. 6. This is the fastest version of the driver and would typically be fabricated with the ECDL wired-OR AND gates to form a logic unit cell.

This version of the Transient Driver "C" contains an additional network 250 which will be identified by one skilled in the art as a standard latching function. By the use of the appropriate clock signals, clock CL and clock bar CLB, the current sources, transistors 253 and 254, can be turned off and on in order to latch a signal from the first stage 259 into the second stage 260. This is a common method of constructing a latch in integrated circuit technology. If the latching function is not needed in the driver of a particular unit cell, then the collector and emitter terminals of transistor 253 would be shorted, effectively removing latching network 250 from the driver. Of course, the entire latching network 250 and transistor 253 may also be removed from the integrated circuit mask if none of these drivers within a system required the latching function.

The two stage Darlington version of the Transient Driver "C" has refined current mirrors 251 and 252, which replace, for example, the current mirror composed of transistors 206 and 207 of FIG. 6. One skilled in the art will recognize that networks 251 and 252 are Wilson current mirrors. These Wilson current mirrors have a much lower dependence on beta, the forward gain factor, than the current mirror used in the drivers of FIGS. 4-6. This current mirror is thus a more stable current source.

An additional modification in this driver involves the active pull-down devices at the output nodes YA3 and YB3. In the previous versions of Transient Driver "C" (FIGS. 4-6), the active pull-down was accomplished by the use of a single transistor driven by an error voltage. For example, in FIG. 6, transistors 205 and 208 perform the pull-down function. The driver of FIG. 7 uses two transistors for the active pull-down in what is known as a Darlington configuration. Transistors 255 and 256 form one Darlington pair and, on the complement output YB3 side, transistors 257 and 258 form another Darlington pair. The two transistor Darlington pair configuration has the advantage of a much larger current drive as compared to the single transistor pull-down of the previous versions of this driver. In fact, as one skilled in the art will know, the overall current gain or beta of the Darlington pair is equal to the product of the individual current gains of the two transistors which make up this configuration. The additional current driving capability of the Darlington pair, transistors 255 and 256, means that the active pull-down has higher and faster current sinking properties. Therefore, the interconnect capacitances at output node YA3 can be more rapidly discharged, which speeds up the operation of the driver. The same also applies to the Darlington pair, transistors 257 and 258, on the complement side.

The novel operation of this driver again is identical to the concept outlined with respect to the single stage Transient Driver "C". In this case, an error voltage between an output node, for example, YA3 in the second stage 260 and the internal reference node XA3 in the first stage 259, drives the Darlington pair, transistors 255 and 256.

The Wilson current mirrors and Darlington pair pull-down networks make this the most versatile and fastest version of the Transient Driver "C". When used as a driver between logic unit cells in the implementation shown, this driver has a propagation delay of only about 190 picoseconds. And as with the other versions of this driver, a very low power is maintained. Other configurations of the two stage Darlington version of Transient Driver "C" may yield slightly different propagation delays without departing from the scope of the invention.

TRANSIENT DRIVER "B"

Figure 8:
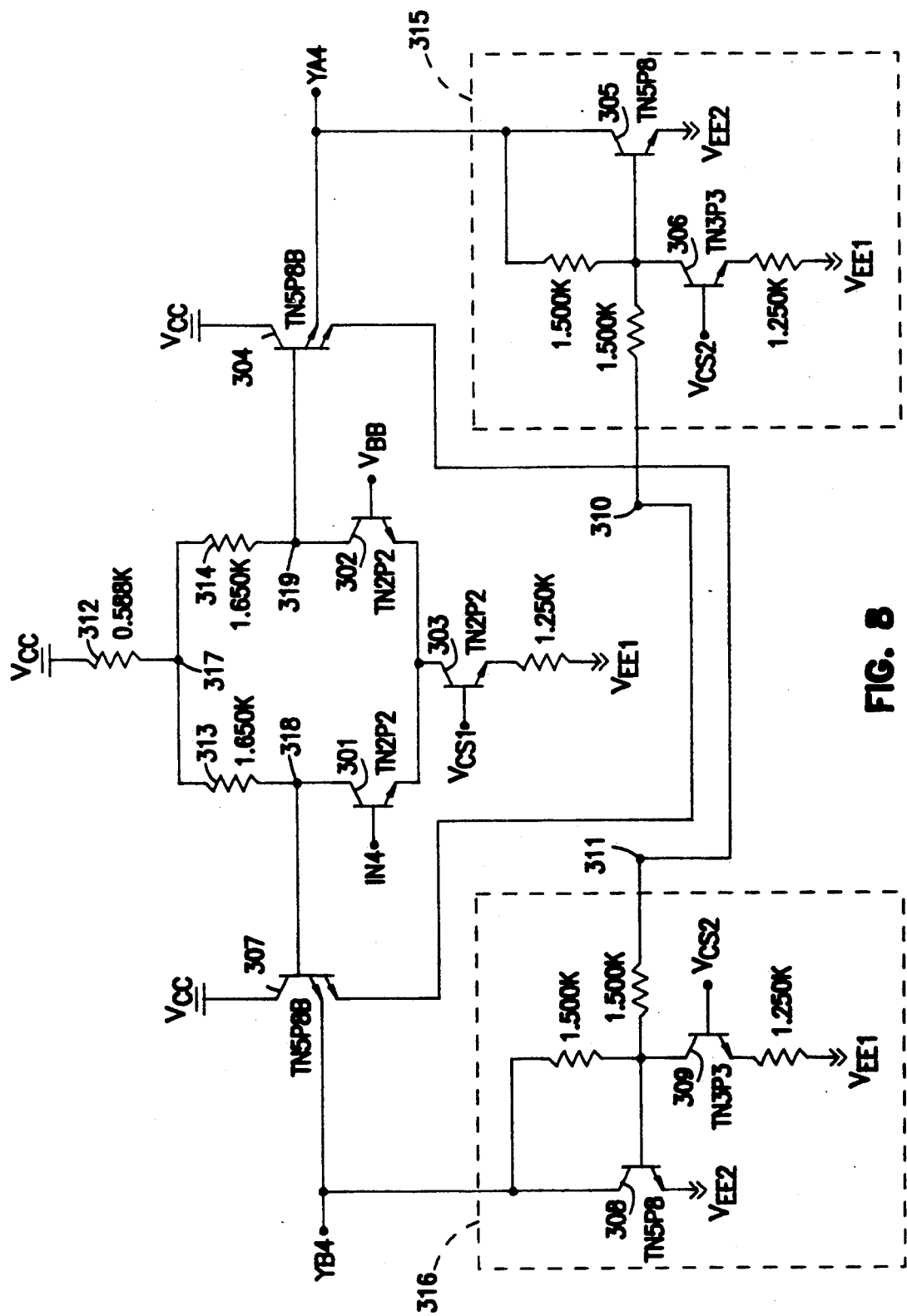
FIG. 8 is a schematic diagram of Transient Driver "B".

FIG. 8 shows a transient driver which will be referred to as Transient Driver "B". This is another type of driver which could be used with logic gates where an amplifier is required between logic arrays. For example, ECDL does not have any gain and, as previously stated, requires an amplifier between logic arrays in order to restore the logic levels and drive interconnect capacitances.

As with the other drivers, Transient Driver "B" utilizes a basic differential amplifier. Transistors 301 and 302 form the differential pair, while transistor 303 acts as a constant current source for the amplifier. Transistors 304 and 307 are emitter follower pull-up devices connected to the true and complement output nodes YA4 and YB4 respectively. And, networks 315 and 316 are active pull-down circuitry.

If this driver were used with ECDL, the logic levels received at the IN4 node would be −0.9 volts and −1.5 volts. When the IN4 node is at −0.9 volts or the logic high, transistor 301 will carry nearly all of the current through the differential amplifier. There will be a slight voltage drop across resistor 312, causing the voltage at node 317 to be approximately −0.1 volts. Since transistor 302 will conduct almost zero current, there will be a negligble voltage drop across resistor 314 and, therefore, the voltage at node 319 will also be about −0.1 volts. The emitter follower pull-up device, transistor 304, will create a baseemitter drop of 0.8 volts between nodes 319 and YA4. Finally, the voltage at the output node YA4 will be −0.9 volts, which is the same as the input.

On the complement side, with the input node IN4 still at −0.9 volts, the voltage at node 318 will be about −0.7 volts due to the voltage drop across resistors 312 and 313. The voltage drop of 0.8 volts from the emitter follower, transistor 307, will cause the voltage at output node YB4 to be −1.5 volts, which is the logic low level. The voltage at node 311 will be the same as the true output node YA4 which is −0.9 volts. This will be sufficient voltage to cause transistor 308 to turn on, sinking current and pulling down node YB4 by discharging interconnect capacitances at node YB4. The voltage at node 310 will be −1.5 volts, which is the same as the complement output node YB4. The lower voltage of −1.5 volts at node 310 will cause transistor 305 to remain in an idle state, such that it is barely conducting.

When the voltage at node IN4 drops from −0.9 volts to the logic low level of −1.5 volts, transistor 301 will stop conducting and nearly all of the current in the differential amplifier will now be steered through transistor 302. Since there is now negligible current through resistor 313, the voltage at node 318 will rise up to −0.1 volts. Subsequently, the voltage at node 310 will quickly rise to −0.9 volts, which is one base-emitter drop down from node 318. As the voltage at node 310 rises, transistor 305 will become more forward biased, turn on, and begin to strongly conduct. When transistor 305 conducts, it will quickly sink current and discharge interconnect capacitances connected to output node YA4, causing the voltage at node YA4 to drop down to the logic low level of −1.5 volts.

In this driver, power is saved by only turning on the active pull-down networks 315 and 316 when needed. The internal reference nodes 310 and 311, which change voltage level quickly, control the pull-down networks. For example, as shown above, when the voltage at the IN4 node drops, the voltage at node 310 rapidly rises. Since node 310 is not loaded down by external capacitances at the output node YA4, it will respond quickly to voltage changes at the IN4 node. The rise in voltage at node 310 turns on transistor 305. The active pull-down is also useful for increasing the speed of the driver since transistors 305 and 308 at the outputs can sink current more efficiently and in less time than passive components.

Figure 9:
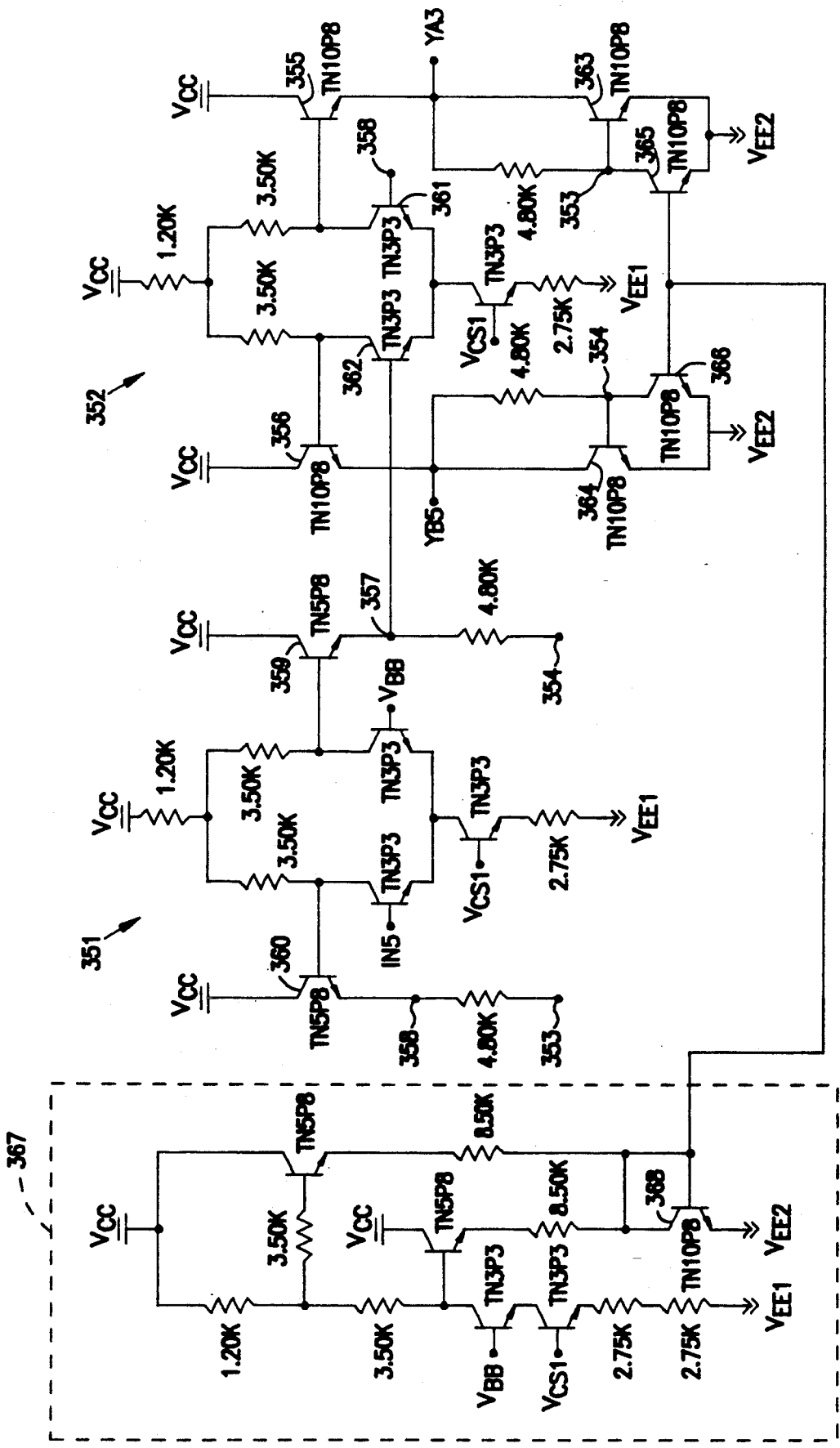
FIG. 9 is a schematic diagram of a two stage version of Transient Driver "B".

FIG. 9 shows a two stage version of Transient Driver "B". This is a simple extension of the single stage Transient Driver "B" using two differential amplifiers connected in series. The input, which could be the output of a logic array, is taken at node IN5 of the first stage 351. The outputs of the first stage, nodes 357 and 358, after being buffered through the emitter follower transistors 359 and 360, are fed into the second stage 352 at the bases of transistors 362 and 361 respectively. The second stage contains the pull-up transistors 355 and 356, which, since they are emitter followers, provide a low output impedance useful for changing capacitive loads at the output nodes YA5 and YB5. Transistors 363 and 364 act as active pull-down devices and are turned on by the voltage at nodes 353 and 354 respectively. Transistors 365 and 366 act as current sources, since their base-emitter voltages are constant, and they regulate the amount of current into the bases of transistors 363 and 364 respectively. Also, transistors 365 and 366 assist in discharging capacitances at the output nodes YA5 and YB5 respectively.

In this two stage version, the cross coupling which regulates the pull-down networks occurs between the first stage 351 and the second stage 352. For example, node 357 on the true side of the first stage is coupled to node 354 which controls the pull-down transistor 364 on the complement side (output node YB5) of the second stage 352.

The conceptual operation of this two stage version is identical to the single stage driver. A change in voltage level at the input node IN5 causes a fast change in voltage at the reference nodes 353 and 354. These reference nodes in turn control the pull-down transistors 363 and 364 respectively. For example, when the voltage at the true output node YA5 is at the high logic level, pull-down transistor 363 will barely conduct and the output voltage will be pulled up by transistor 355. On the other side of the second stage 352, the voltage at node 354 will be at the high logic level, which will cause transistor 364 to strongly conduct, sinking current and pulling down output node YB5.

The circuitry of network 367 shows one method of providing the biasing voltage VCS2 for the current sources, transistors 365 and 366. The current through transistor 368 is mirrored into transistors 365 and 366. This is only one method of providing a biasing voltage and one skilled in the art will recognize that there are many methods of supplying a constant voltage.

Transient Driver "C", Transient Driver "B", and the variations thereof may also be used for driving off-chip loads. In this case, more power is needed than in the case of driving signals between gates. The additional power required is achieved by changing the pull-up and pull-down transistors during fabrication. As known to one skilled in the art, the power of a bipolar junction transistor is directly related to the area of the emitter, or, in particular, the area of the emitter-base junction. In the case of driving off-chip loads, the pull-up and pull-down transistors of the drivers are fabricated with longer emitters to supply the additional power required.

PROGRAMMABLE CURRENT SWITCH DRIVER

Figure 10:
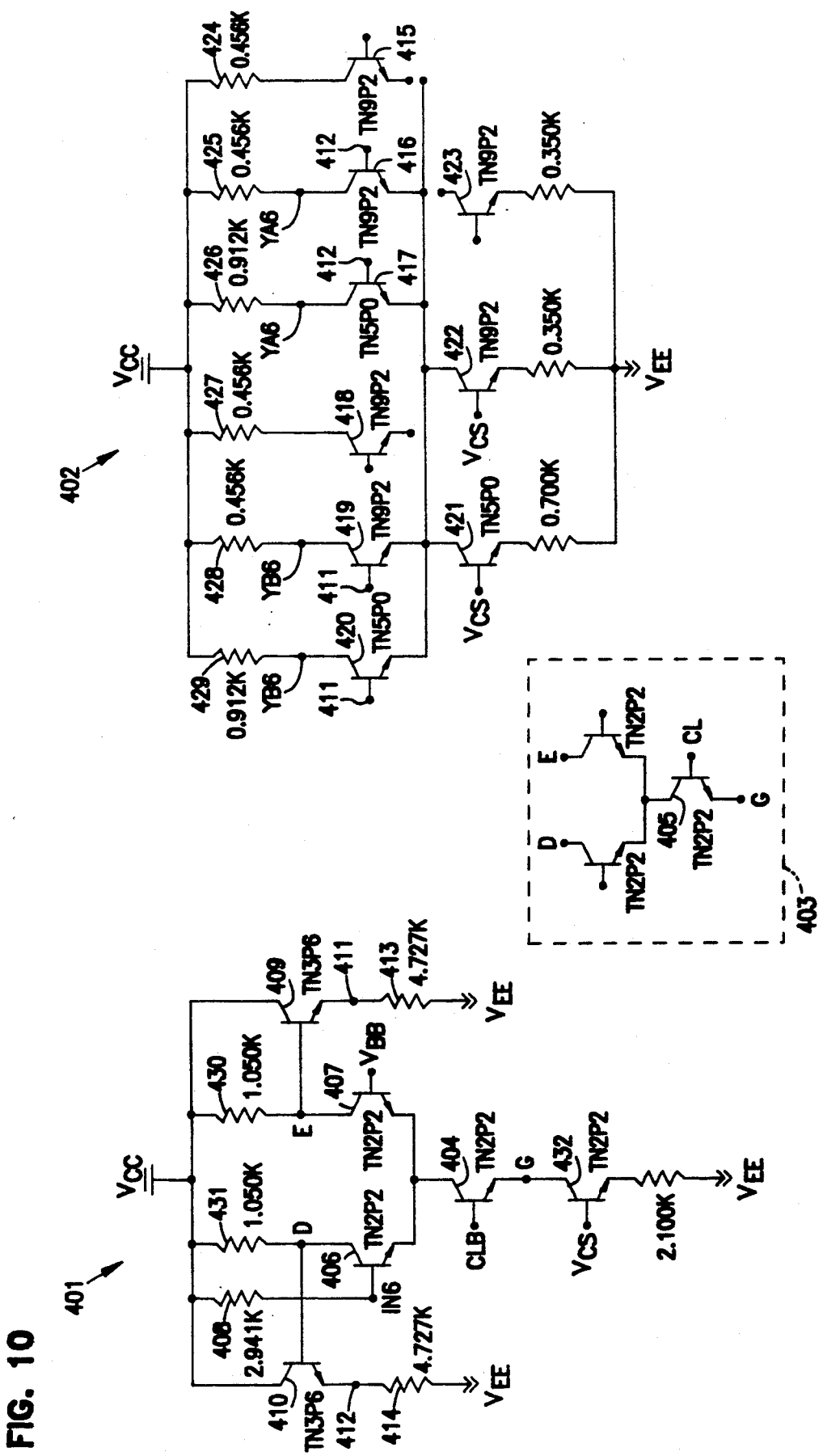
FIG. 10 is a schematic diagram of the Programmable Current Switch Driver.

FIG. 10 shows the Programmable Current Switch Driver in one of its possible configurations. This driver basically consists of a predriver network 401, a standard latch 403, and a driver 402 which may be programmed for various power levels.

The standard latch 403 is well-known in the art and operates in the manner previously explained. When the latch is used, the clock CL and clock bar CLB signals applied to the bases of transistors 405 and 404 respectively control when the current sources to the predriver 401 and latch 403 are on or off in order to transfer a signal from the predriver 401 to the driver 402. If the latch is not needed, the collector and emitter terminals of transistor 404 would be shorted during fabrication, effectively removing the latch 403 from the driver.

A typical application of this driver would be as an amplifier between logic arrays. The output of the logic is connected at node IN6, which is the input to the differential pair, transistors 406 and 407. Resistor 408 is used as a pull-up device, so that when the output of the logic is in the high state, the IN6 node will be pulled up to the high level. The voltage at node IN6 is compared to the reference voltage VBB and the difference is amplified and appears at the collectors of transistors 406 and 407. One skilled in the art will be well aware of this property of the basic differential amplifier. Transistors 409 and 410 are emitter follower level shifters. By shifting down the voltage level of the outputs of the predriver 401 at nodes 411 and 412, a larger logic swing may be achieved. At the output nodes 411 and 412 of the predriver 401, transistors 409 and 410 also act as pull-up devices and resistors 413 and 414 are passive pull-down devices.

The driver stage 402 consists of a differential amplifier. Transistors 415–420, depending upon which ones are used, receive the inputs on the bases and drive the output at the collector terminals. Transistors 421–423 are available for use as a current source to the differential amplifier.

The programmability of the driver stage 402 allows it to be configured with different power ratings depending upon the intended application. The driver is "programmed" by connecting whichever transistors 415–423 are needed. Transistors 415–417 are the true output side of the driver, which follows the voltage at node IN6. And transistors 418–420 form the complement side. The number of transistors 415–417 connected on the true side must match the number of transistors 418–420 connected on the complement side. Obviously, at least one of the current sources, transistors 421–423, must be connected in order for the driver to operate. When more power is required, more transistors 415–420 or more current sources, transistors 421–423, may be connected.

The driver stage 402 of FIG. 10 shows an example of one method of programming the driver. In this example, transistors 416 and 417 are used to drive the true output node YA6 and the corresponding transistors 419 and 420 are used to drive the complement output node YB6. Two of the current sources, transistors 421 and 422, are used to drive the differentially connected transistors 416, 417, 419, and 420. By connecting two transistors in parallel at the output, for example, transistors 419 and 420, the output has more drive capability by reducing the equivalent resistance at node YB6. If resistors 428 and 429 are equal, connecting them in parallel results in an equivalent resistance equal to half the value of resistor 428 or 429, which means that twice as much drive capability will be achieved.

Transistors 421–423, the current sources for the driver stage 402, would typically be fabricated with one, two and four units of power, so that between one and seven units of power are available for the driver. The present example, since transistors 421 and 422 are connected, uses three units of power. When more power is used, a higher amount of current is available for discharging capacitances at the output nodes YA6 and YB6. This results in a higher speed, as well as more heat dissipation and power consumption.

One skilled in the art will recognize that a differential amplifier operates by current steering. The current sources, transistors 421–423, whichever are used, will sink a constant supply of current. The differentially coupled transistors 415–420, whichever are used, will steer the current from one side of the amplifier to the other depending upon the voltage levels received at the bases of the transistors.

As an example, if the voltage at the IN6 node is at the high logic level of approximately zero volts, transistor 406 will carry most of the current sourced by transistor 432 and transistor 407 will barely conduct. Since there will be negligible current through resistor 430, node 411 will be pulled up to the high level by transistor 409. Thus, the voltage at node 411, which through transistor 409 is one base-emitter voltage drop down from the ground terminal, will be at −0.8 volts. On the other side, the current drawn by transistor 406 will cause a potential difference across resistor 431, lowering the voltage at node 412, through transistor 410, to −1.0 volts. The voltages at nodes 411 and 412 are fed into the driver stage 402. If the latch 403 is used, the voltages at nodes 411 and 412 would first be clocked through the latch. At the driver stage 402, the high logic level at node 411 will turn on transistors 419 and 420, causing them to sink current and discharge capacitances at output node YB6, so that the voltage at node YB6 will be at the logic low level. The low voltage at node 412 will cause transistors 416 and 417 to barely conduct, due to a lower base-emitter biasing voltage. Therefore, the output node YA6 will be pulled up to the high logic level.

By varying the input voltage, the constant supply of current can be steered from one side of the differential amplifier to the other. This will cause a change of the output voltage levels. This current steering is useful in avoiding the large current spikes of drivers which switch transistors off and on.

The novelty of the Programmable Current Switch Driver involves the versatility of the driver stage 402. All of the components of the complete driver would be fabricated at each location in a system which uses the driver. The power may be varied depending upon the requirements of each system location by making the appropriate connections in driver stage 402. The components not needed would be left unconnected. This is a clever and efficient method of using the same basic driver mask to fabricate drivers with different amounts of power to meet varying system requirements.

Also, this two stage design avoids the problem of saturating transistors found in current mode logic. And, by shifting down the voltages before the second stage, a larger logic swing is maintained. The use of resistors as pull-up devices in the second stage 402, in comparison to the emitter follower outputs of current mode logic, means that a lower supply voltage may be used. The lower supply voltage saves power. The Programmable Current Switch Driver is a fast and power efficient amplifier. A typical application would be as a driver in an ECDL unit cell. The driver and ECDL gates would be fabricated as a package and the driver would amplify and restore logic levels between gates. The driver may also be used for driving off-chip loads.

SOURCE DRAIN DOTTED LOGIC (SDDL)

Figure 11:
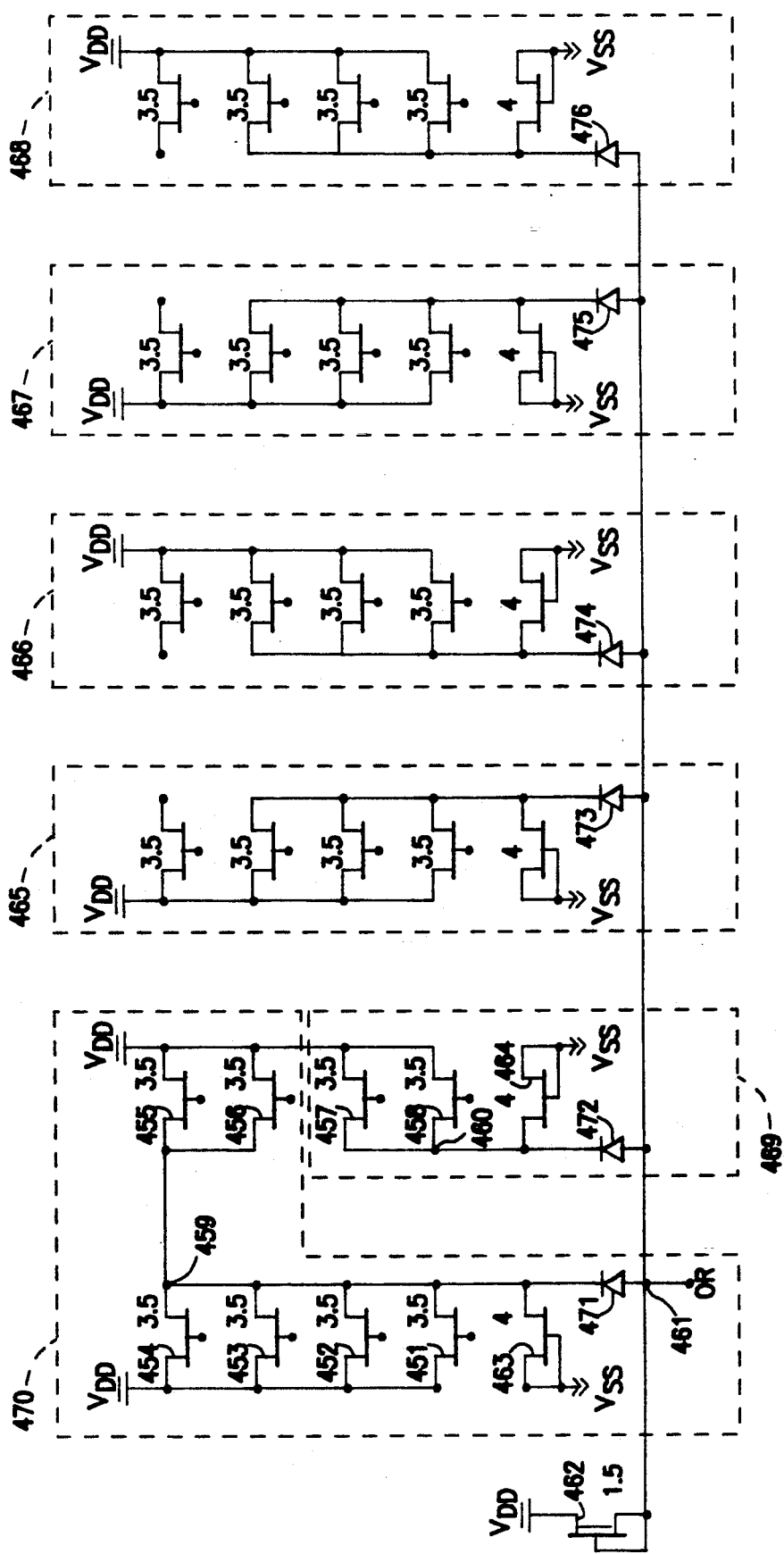
FIG. 11 is a schematic diagram of a two level Source Drain Dotted Logic array in a sum-of-products configuration, which is the implementation of Emitter Collector Dotted Logic in gallium arsenide.

FIG. 11 shows a two level Source Drain Dotted Logic (SDDL) array in a sum-of-products configuration, which is an implementation of ECDL in gallium arsenide (GaAs). This is a straight translation, using depletion mode and enhancement mode MESFETs, of ECDL into GaAs.

SDDL functions in the same manner as the ECDL shown in FIGS. 1 and 3. Node 459 is the wired-AND node of the input transistors and node 461 is a wired-OR of the AND gates. The first gate consists of transistors 451–456 wire-ANDed at node 459 along with transistor 463 and diode 471. The inputs to the second gate are taken at the gates of transistors 457 and 458 and again these transistors are wire-ANDed at node 460. This circuit also has four additional AND gates 465–468 and all six gates are wire-ORed at node 461.

As in Silicon (Si) ECDL, SDDL has high input impedances due to the high impedance looking into the gates of the input enhancement mode MESFETs, for example, transistors 451–456. In SDDL, transistor 463 has replaced the resistor 111 (FIG. 1A) in Si ECDL. Resistors do not work well in GaAs, therefore, a transistor is more efficient and performs the same function in this circuit. Also, the diode-connected transistor 100 in Si ECDL has been replaced by the Schottky diode 471, which performs the same function. Like Si ECDL, the entire logic array may be configured by the system designer in terms of the inputs needed per gate. The input transistors not used are left unconnected.

The operation of SDDL, in terms of generating the proper output voltages, is similar to Si ECDL. If any of the inputs to the first gate (the gates of transistors 451-456) are at the high voltage level, which in negative logic corresponds to a logic 0, at least one MESFET (transistors 451-456) will turn on and pull up the voltage at node 459. If any input is a logic 0, the output 459 will be a logic 0, which is the AND function. When all the inputs are at the low voltage or logic 1 level, transistors 451-456 will be off and the voltage at node 459 will be pulled down by transistor 463. As the voltage at node 459 drops, Schottky diode 471 will conduct, pulling down node 461. If the outputs of any of the AND gates 465-470 are at the low voltage level, at least one of the Schottky diodes 471-476 will conduct and node 461 will be pulled down to the logic 1 level, which is the OR function. If the output of all the AND gates 465-470 are at the logic 0 level, the Schottky diodes 471-476 will barely conduct, and the voltage at node 461 will be pulled up to the high level (logic 0) by a current source, transistor 462.

Due to the favorable characteristics of GaAs, the two level SDDL circuit of FIG. 11 uses much less power than Si ECDL. The speed of SDDL is approximately equal to Si ECDL. The main advantage of SDDL is that it uses significantly less power without sacrificing the speed of Si ECDL.

GALLIUM ARSENIDE DRIVER

Figure 12:
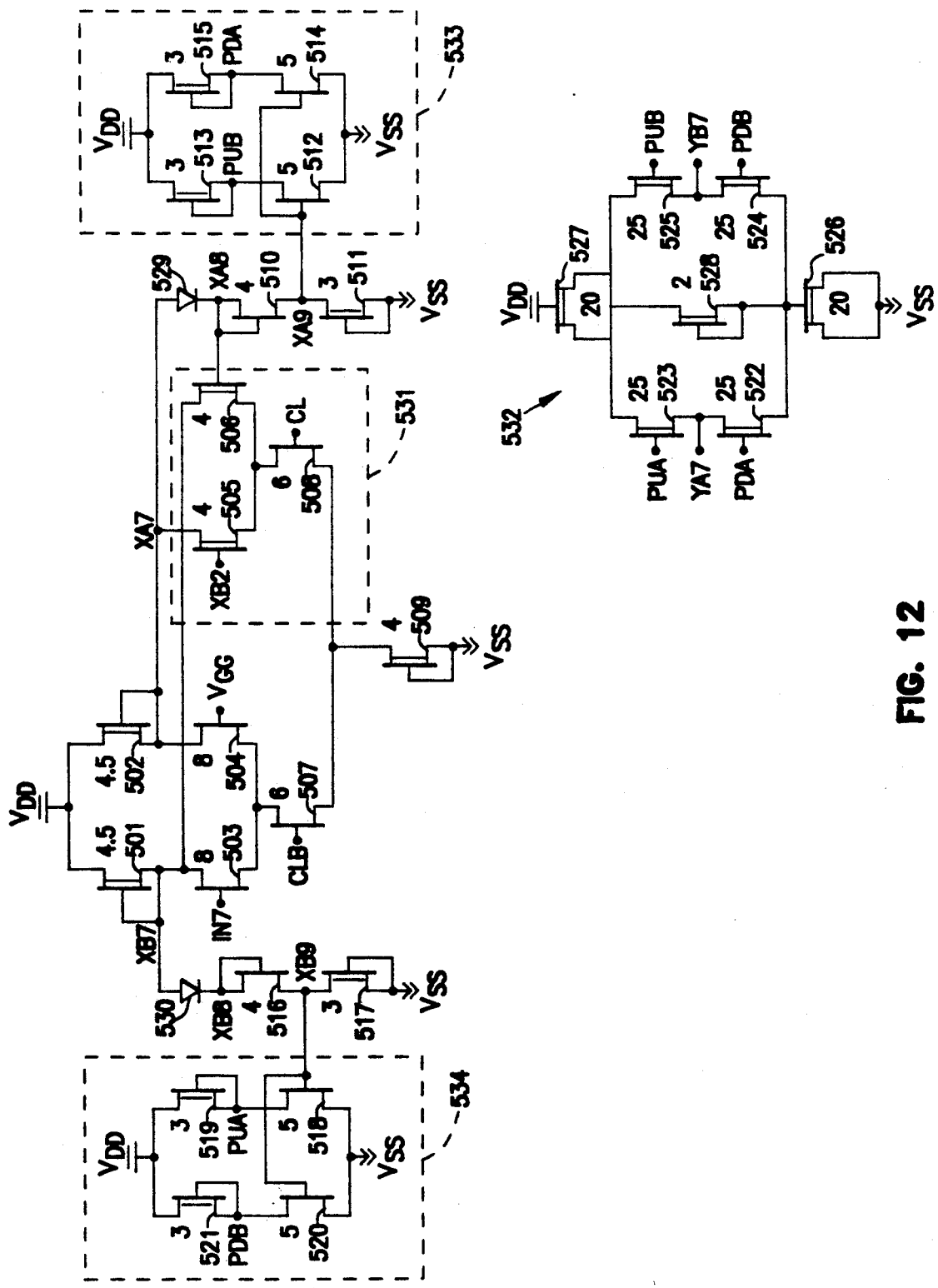
FIG. 12 is a schematic diagram of a driver implemented in gallium arsenide.

FIG. 12 shows a GaAs driver which is typically used with the SDDL array of FIG. 11 in order to provide gain lost in the logic. SDDL has no gain, which means that it must be used with a driver when cascading groups of gates. A complete logic unit cell would consist of the six SDDL AND gates wire-ORed together and a GaAs driver.

The GaAs driver has the same latching circuitry 531 as some of the other drivers. The latching is controlled by the clock CL and the clock bar CLB signals applied to the gates of transistors 508 and 507 respectively. If the latch is not needed, the source and drain terminals of transistor 507 would be shorted and the drain and gate terminals of transistors 505 and 506 would be left floating.

The input voltage, which would be the output of a logic gate, would be connected at node IN7 and compared to the voltage VGG by the differentially connected transistors 503 and 504. If, for example, a high voltage is present at node IN7, transistor 503 will conduct and transistor 504 will be off. The current through transistors 503 and 517 will be strong enough to pull down node XB7. Therefore, the voltage at node XB9, which is shifted down by diode 530 and transistor 516, which is a quadratic type of diode, will not be sufficient to turn on transistors 518 and 520. Since transistors 518 and 520 are not conducting, the voltage at nodes PUA and PDB will be pulled up to the high level by transistors 519 and 521.

On the other side of the driver, since transistor 504 is not conducting, the current through transistor 511 is not sufficient to pull down the voltage at node XA7. Transistor 502, which is simply a current source, will pull up the voltage at node XA7. The voltage at node XA9, which is the voltage from node XA7 shifted down by diode 529 and transistor 510, will rise and turn on transistors 512 and 514. Thus, the voltages at nodes PUB and PDA will be pulled down to the low level.

The signals generated at nodes PDB, PUA, PUB and PDA, which represent the voltages used to pull down node YB7, pull up node YA7, pull up node YB7, and pull down node YA7 respectively, are delivered to the output stage 532. In the present example, the voltages at nodes PUA and PDB are at the high level and the voltages at nodes PDA and PUB are at the low level. The low voltage at nodes PDA and PUB will turn off transistors 522 and 525 respectively. Also, the high voltages at nodes PUA and PDB will turn on transistors 523 and 524 respectively. Therefore, the voltage at the true output node YA7 will be pulled up to the high logic level and transistor 523 will source current in order to charge interconnect capacitances at node YA7. On the other side of stage 532, the voltage at node YB7 will be pulled down to the low logic level and transistor 524 will sink current, discharging interconnect capacitances at node YB7.

In the output stage, transistors 526 and 527 act as diodes and transistor 528 acts as a current source, which is left idling to supply current to the pull-up and pull-down devices, transistors 522-525. The pair of transistors 522 and 523, as shown above, are a push-pull stage for output node YA7. Likewise, transistors 524 and 525 provide a pushpull drive capability for node YB7. Depletion mode MESFETs are used in the output stage since they have about three times the drive capability of enhancement mode MESFETs. In the driver shown, transistors 522-525 are overdriven to supply sufficient current for charging and discharging interconnect capacitances. By using depletion mode MESFETs in the output stage 532, the higher drive capability can be utilized in order to maintain small device sizes without sacrificing drive capability, which is lower in enhancement mode MESFETs.

In the first stage, transistors 513, 515, 519 and 521 are simply current sources. Transistors 512, 514, 518 and 520 can be switched off and on by the voltages at nodes XA9 and XB9. Networks 533 and 534, as previously shown, are used to generate the voltages PDB, PUA, PUB and PDA which drive the output stage 532.

The GaAs driver also contains a novel self-clamping feature. In the previous example, with a high voltage at node IN7, the combined current through transistors 503 and 517 was sufficient to pull down the voltage at node XB7. The voltage at node XB7 will only be pulled down as long as transistor 517 is conducting. As the voltage at node XB9 approaches VSS, the drain to source voltage of transistor 517 will go to zero. When that occurs, transistor 517 will stop conducting and, thus, the voltage at node XB9 will remain at constant low level and not be pulled down any further. This same property applies to the voltage at node XA9 when the voltage at node IN7 is low.

EMITTER EMITTER LOGIC (EEL)

Figure 13:
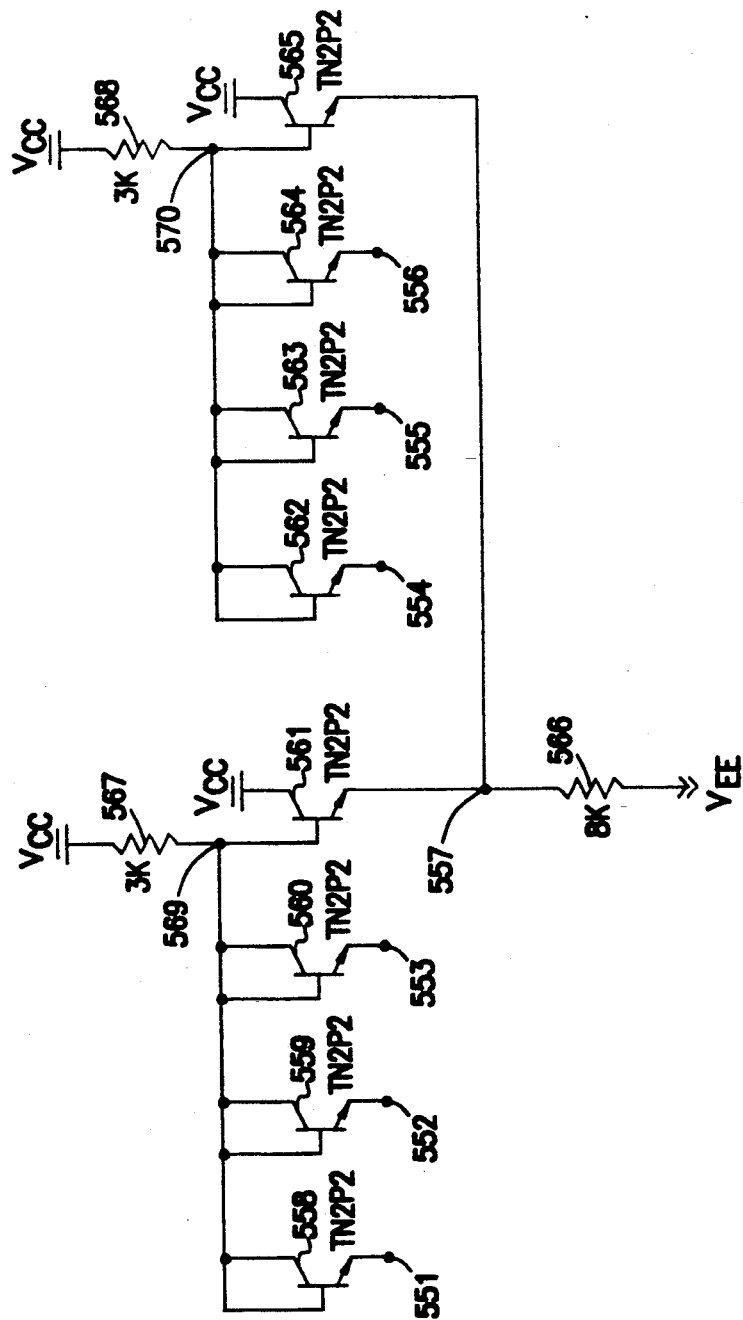
FIG. 13 is a schematic diagram of a two level Emitter Emitter Logic array in a sum-of-products configuration.

FIG. 13 shows an Emitter Emitter Logic (EEL) array which consists of two AND gates wire-ORed together in a sum-of-products configuration. The first AND gate consists of input transistors 558-560, output transistor 561, pull-up resistor 567, and pull-down resistor 566. The second AND gate is wire-ORed with the first at node 557 and resistor 566 is also used as a pull-down device for the second AND gate.

Nodes 569 and 570 are AND nodes in positive logic. The wired-OR node 557 also uses positive logic. For example, if any of the input nodes 551-553 are at a low voltage, which is a logic 0 at the first level, at least one of the transistors 558-560 will conduct, pulling down the voltage at node 569. With an input at $-1.5$ volts, using the logic levels or $-0.9$ volts and $-1.5$ volts, the voltage at node 569 will be one base-emitter drop above that, which is −0.7 volts. The voltage at node 557, the output of the first level, will be one base-emitter drop down from node 569 or −1.5 volts. Therefore, if any input is a logic 0, the output will also be a logic 0.

Now, if all of the input nodes 551-553 are at the high level of −0.9 volts, transistors 558-560 will be off and the voltage at node 557 will be pulled up to the high level of −0.9 volts by resistor 567.

If the output of either the two AND gates is at the high level of −0.9 volts, node 557 will be pulled up to the high voltage level. In positive logic, this is the OR function.

Positive logic is used with EEL in order to configure the array as a sum-of-products. The EEL array shown may also be used with negative logic, in which case, due to the duality of the AND and OR functions between positive and negative logic, it would be a product-of-sums configuration.

When an input is at the logic 0, which at the input is a low voltage, EEL has the advantage of providing current to the input. For example, when node 551 is at the low voltage, transistor 558, acting as a diode, will turn on and supply current to node 551. The current supplied by the input flows into the previous gate, or with this logic, it would flow into the driver of the previous gate. The driver of the previous gate uses the current supplied by the input of the gate to discharge interconnect capacitances and pull down the node between the driver and input.

The current sourced by the inputs in the low voltage state will also limit the fan-out. For example, if an EEL gate has a fan-out of eight, then the next inputs supply eight currents when the output is in the low voltage state. The driver at the output must be able to discharge the interconnect capacitances and sink all eight of these currents from the next inputs.

EEL is a very fast logic. These two levels of logic, the AND and wired-OR, switches in about 50 picoseconds. The very high speed of EEL is useful in supercomputers, for example, the type developed by Cray Research, Inc., the assignee of the present invention. As with ECDL, however, EEL would need a driver between logic arrays. The driver is used to restore the logic levels and to drive the metal of the interconnects. Also, in EEL, the driver is needed to handle all of the current supplied by the inputs in the low voltage state.

SOURCE FET LOGIC (SFL)

Figure 14:
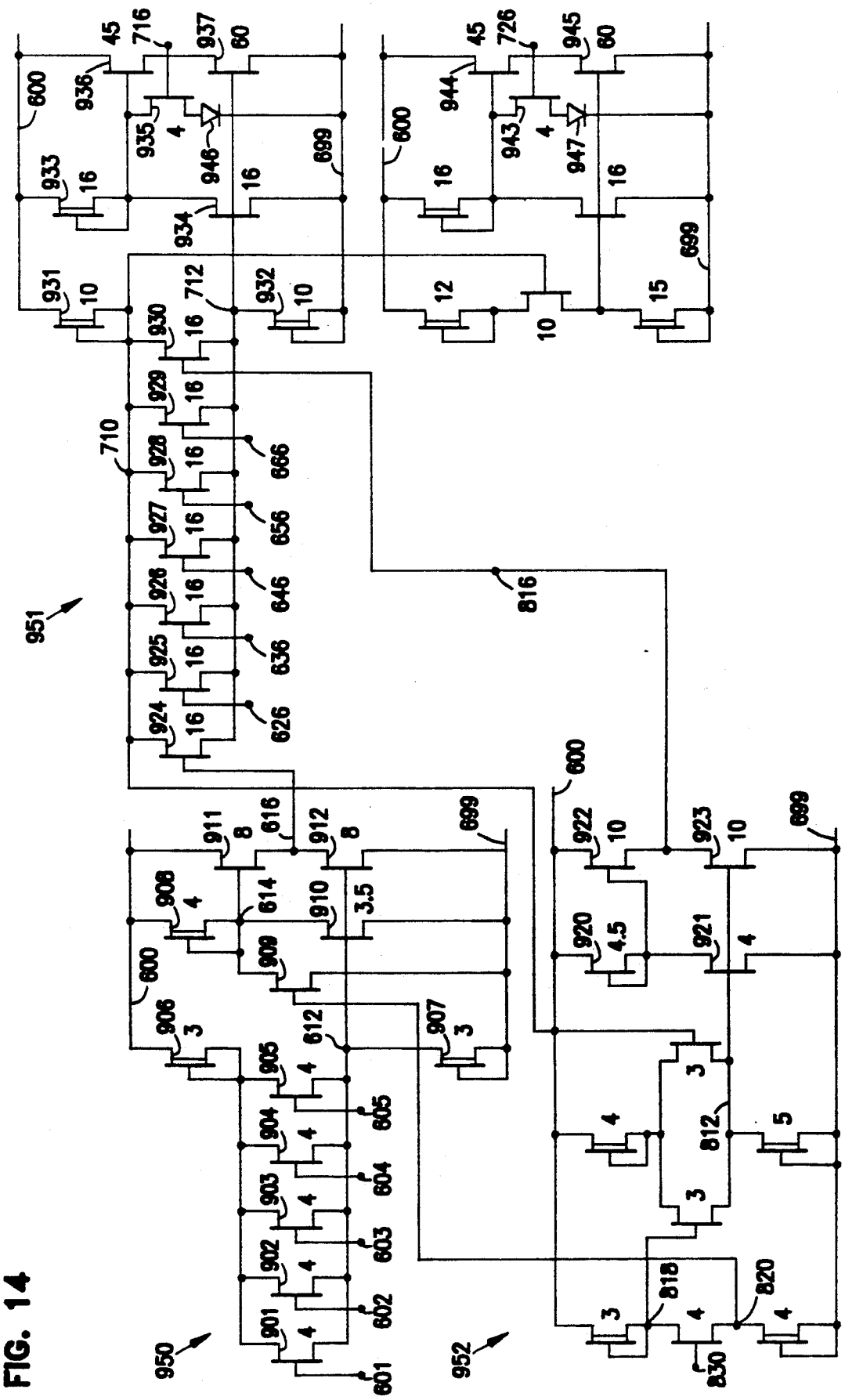
FIG. 14 is a schematic diagram of a portion of a Source FET Logic array in a sum-of-products configuration.

FIG. 14 shows the basic configuration for a two stage sum-of-products Source FET Logic (SFL) array, using depletion mode and enhancement mode GaAs MESFETs.

The first stage 950 is a basic NAND gate in negative logic. The inputs are applied at nodes 601-605 of the input enhancement mode MESFETs, transistors 901-905. The input has a swing of 1.5 volts with input levels of −0.5 volts and −2 volts. Applying the inputs to the gates of the transistors 901-905 also offers the advantage of a high input resistance. Transistors 906 and 907 are depletion mode MESFETs, which, as with the other depletion mode MESFETs in the circuit of FIG. 14, are used as current sources. Nodes 600 and 699 are the supply voltage rails at zero and −2 volts respectively.

Next, node 612 is simply a shifted down version of the input voltages from nodes 601-605, which are ANDed at node 612. The ANDed result of the inputs at node 612 is then delivered to an inverter, transistors 908 and 910. Transistors 911 and 912 form a push-pull driver for the output node 616. The AND function at node 612 in combination with the inverter, transistors 908 and 910, constitutes the NAND function at node 616 of the inputs from nodes 601-605.

If all of the inputs are a logic 1, which in negative logic is the low voltage of −2 volts, the voltage at node 612 will be pulled down. As previously stated, the voltage at node 612 will be the input voltage shifted down. The low voltage at node 612 will be less than the threshold voltage of the enhancement mode MESFETs, transistors 910 and 912, and consequently, transistors 910 and 912 will be off.

The voltage at node 614 will be pulled up since transistor 910 is off. Transistor 911 will turn on and source current, charging capacitances at node 616 and therefore, establishing a high voltage or logic 0 output. If all of the inputs at nodes 601-605 are a logic 1, the output at node 616 will be a logic 0.

Now, if any of the inputs, nodes 601-605, are a logic 0, the voltage at node 612 will be pulled up. The high voltage at node 612 will turn on transistors 910 and 912. Transistor 910 will draw current and pull down the voltage at node 614, which will cause transistor 911 to turn off. With transistor 911 off and transistor 912 on, capacitances at node 616 will be discharged through transistor 912 and, therefore, the voltage at node 616 will be pulled down to a low voltage (logic 1) level. As shown, if any the inputs at nodes 601-605 are a logic 0, the output at node 616 will be a logic 1.

The push-pull driver, transistors 911 and 912, is an efficient method of achieving sufficient drive capability without using excessive amounts of power.

The output from the first stage, node 616, is coupled to the second stage 951. The actual implementation would have additional stages identical to stage 950 coupled to the remaining inputs, nodes 626, 636, 646, 656 and 666, of the second stage 951. The complete implementation of an SFL unit cell, of which only a portion is shown in FIG. 14, would consist of six first stages identical to stage 950 except each having ten inputs, coupled to second stage 951, and the latch, network 952.

The ten inputs to the first stages and the six inputs to the second stage 951 are the values for the implementation shown. As one skilled in the art will recognize, the fan-in of the first and second stages could be changed without departing from the scope of the invention.

The second stage 951 receives the outputs from the first stages at nodes 616, 626, 636, 646, 656, and 666. The second stage 951 is basically a repeat of the first stage 950, except that larger devices are used for all transistors. The depletion mode MESFETs, transistors 931-933 are used as current sources. And as in the first stage 950, transistors 936 and 937 form a push-pull driver for the true output node 716. When the six first stages are coupled to the second stage 951, node 716 is the sum-of-products of the inputs to the first stages. In other words, the Boolean function at node 716 accomplished by the complete implementation is the summation of the products of the inputs to each of the first stages. Each product in the summation is formed by the inputs to a particular first stage.

Node 716 in the second stage 951 is the true output or sum-of-products as described above. Node 726 is the complement output, which is achieved by coupling node 710 to an output network identical to the output network driving node 716. The voltage at node 710 is the complement of the voltage at node 712. As in the operation of first stage 950, the voltage at node 712 controls the true output push-pull driver, transistors 936 and 937. The voltage at node 710 controls the complement output push-pull driver, transistors 944 and 945.

The true and complement drivers of the second stage 951 have additional circuitry as compared to the push-pull driver, transistors 911 and 912, of the first stage 950. The additional components, for example transistor 935 and diode 946 on the true output driver, are used as a clamping network to prevent the output voltage at node 716 from rising too high. When the voltage at node 716 is at the high logic level of −0.5 volts, transistor 936 will source current to charge capacitances at node 716. Also, the high voltage at node 716 will turn on transistor 935, which will source current through diode 946. As transistor 935 conducts, the voltage drop across diode 946 and the gate-source junction of transistor 935 will hold the output voltage at node 716 at an upper limit. The clamping network, transistor 935 and diode 946, will maintain a 1.5 volt swing at node 716. Transistor 943 and diode 947 clamp the voltage at node 726 is an identical manner.

Network 952 is a latching circuit. The clock signal controls the latch at node 330, and a shifted down version of the clock signal is connected to the transistor 909 in the first stage 950 at node 820. By using the clock signal at its gate, transistor 909 can control the output push-pull driver, transistors 911 and 912, of the first stage 950. When the clock signal is at a high voltage, transistor 909 turns on, pulling down the voltage at node 614 and disabling the push-pull driver, transistors 911 and 912. With the driver disabled, node 616 is left in a high impedance state, which is similar to the third state of a tri-state output. The additional first stages coupled to second stage 951 would each have an enhancement mode MESFET connected at the same location as transistor 909 of first stage 950, and the clock signal at node 820 would be connected to the gates of all of these transistors. With a transistor at each of the lock points in each of the first stages, for example node 614 of stage 950, all of the first stages are disabled when the clock signal is at a high voltage.

The latch 952 uses a NAND gate to transfer the signals from the first stages to the second stage 951. the clock signal is one input to the NAND gate at node 818. The other input to the NAND gate is at node 710, and this is a feedback signal from the second stage 951. The output of the NAND gate is node 812, which is connected to an inverter, transistors 920 and 921, and a push-pull driver, transistors 922 and 923. As in the other stages, the enhancement mode MESFETs are used as current sources. The output node 816 of the latch is then ANDed with the data in the second state 951.

If the clock is in the transparent stage, node 816 will be held at −2 volts or a logic 1, and the transistors at the lock points, for example transistor 909, of the first stages will be off, disabling the outputs of the first stages. When the clock is in the latching stage, the voltage at node 816 will be held at whatever the feedback at node 710 from the NAND function cues on node 812. And, data will be blocked from the first stages to the second stage 951.

The latch 952 would be fabricated with a complete SFL unit cell as previously described. If the latch was not needed in a particular application, nodes 830, 816 and 820 would be left unconnected during fabrication, effectively removing the latch from the logic unit cell.

The use of GaAs MESFETs in the SFL array provides for logic with a high speed and low power dissipation, both of which are important in the design of supercomputer systems, such as the type developed by Cray Research, Inc., the assignee of the present invention.

While the present invention has been described in connection with the preferred embodiment thereof, it will be understood that many modifications will be readily apparent to those skilled in the art, and this application is intended to cover any adaptations or variations thereof. For example, the drawings indicate a particular embodiment in terms of the values of the components and the types of transistors. One skilled in the art will recognize that the values of the components may be changed or transistors with different gate widths or emitter lengths may be used without departing from the scope of the invention.

It is manifestly intended that this invention be limited only by the claims and equivalents thereof.

We claim:

1. A logic circuit, comprising:
   (a) a plurality of logic gates, each of said plurality of logic gates comprising:
      (i) a plurality of first transistors, each of said plurality of first transistors having a collector directly coupled to a first voltage terminal, an emitter coupled to a node, and a base coupled to one each of a plurality of first input terminals;
      (ii) a diode having a cathode coupled to said node and an anode coupled to a first output terminal; and
      (iii) means, coupled between said node and a second voltage terminal, for sinking current; and
   (b) a driver, coupled to said first output terminal, comprising means for amplifying a voltage and restoring logic levels at said first output terminal.

2. The circuit according to claim 1, said driver further comprising:
   a second input terminal coupled to said first output terminal;
   a second output terminal;
   means for charging a capacitive load coupled to said second output terminal;
   a network coupled to said second output terminal, said network having a first state, comprising: means for rapidly discharging a capacitive load; and a second state, comprising: means for dissipating a minimum of power;
   means for generating an error voltage between a reference node and said second output terminal in response to voltage changes at said second input terminal; and
   means for switching said network between said first state and said second state in response to said error voltage.

3. The circuit according to claim 2, wherein said means for switching said network between said first state and said second state comprises a second transistor having a collector coupled to said second output terminal, a base, and an emitter, said transistor being operative such that a base-emitter voltage of said transistor is controlled by a difference between a first voltage at said second output terminal and a second voltage at said reference node.

4. The circuit according to claim 2, wherein said second input terminal and said reference node are contained within a first stage; said second output terminal and said means for charging a capacitive load are contained within a second stage; and said means for generating an error voltage, said network, and said means for switching said network are contained in said first stage and said second stage.

5. The circuit according to claim 4, wherein said means for rapidly discharging a capacitive load of said first state of said network comprises:
a second transistor having a collector coupled to said second output terminal, a base coupled to a current source, and an emitter; and
a third transistor having a collector coupled to said second output terminal, a base coupled to said emitter of said second transistor, and an emitter coupled to said second voltage terminal.

6. The circuit according to claim 1, said driver further comprising:
a second input terminal coupled to said first output terminal;
a second output terminal;
a third output terminal;
first means for charging a capacitive load coupled to said second output terminal;
second means for charging a capacitive load coupled to said third output terminal;
a first network coupled to said second output terminal and a second network coupled to said third output terminal, said first network and said second network each having a first state, comprising: means for rapidly discharging a capacitive load; and a second state, comprising: means for dissipating a minimum of power; and
means for switching said first network and said second network between said first state and said second state in response to voltage changes at said second input terminal.

7. The circuit according to claim 6, wherein said second input terminal is contained within a first stage; said second output terminal, said third output terminal, said first means for charging a capacitive load, said second means for charging a capacitive load, said first network, and said second network are contained within a second stage; and said means for switching said first network and said second network is contained in said first stage and said second stage.

8. The circuit according to claim 1, said driver further comprising:
a second input terminal coupled to said first output terminal;
a pair of second output terminals;
a first stage, comprising: means for generating a pair of complementary signals in response to a comparison between a voltage at said second input terminal and a reference voltage;
means responsive to said pair of complementary signals for generating power in a second stage in order to charge and discharge capacitive loads coupled to said pair of second output terminals; and
means for setting said power in said second stage to any one of a plurality of discrete values within a range of values during fabrication of said driver.

9. The circuit according to claim 1, wherein said diode comprises: a first transistor with its base terminal coupled to its collector terminal.

10. A logic circuit, comprising:
(a) a plurality of logic gates, each of said plurality of logic gates comprising:

(i) a plurality of first transistors, each of said plurality of transistors having a drain coupled to a first voltage terminal, a source coupled to a node, and a gate coupled to one each of a plurality of first input terminals;
(ii) a second transistor having a source coupled to said node, a drain coupled to a second voltage terminal, and a gate coupled to said second voltage terminal;
(iii) a diode having a cathode coupled to said node and an anode coupled to a first output terminal; and
(b) a driver, coupled to said first output terminal, comprising means for amplifying a voltage and restoring logic levels at said output terminal.

11. The circuit according to claim 10, said driver further comprising:
a second input terminal coupled to said output terminal;
a pair of second output terminals;
a first stage, comprising: means for generating a first pair of voltages and a second pair of voltages in response to a voltage at said input terminal, and means responsive to a voltage at said second input terminal for establishing a lower limit for said first pair of voltages and said second pair of voltages; and
a second stage, comprising: means for discharging and charging capacitive loads coupled to said pair of second output terminals in response to said first pair of voltages and said second pair of voltages.

12. The circuit according to claim 10, wherein said logic circuit is fabricated in gallium arsenide.

13. A logic circuit, comprising:
(a) a plurality of logic gates, each of said plurality of logic gates comprising:
(i) a plurality of first transistors, each of said plurality of transistors having a collector coupled to a node, a base coupled to said node, and an emitter coupled one each to a plurality of first input terminals;
(ii) a second transistor having a collector coupled to a first voltage terminal, a base coupled to said node, and an emitter coupled to a first output terminal;
(iii) first resistive means coupled between said first output terminal and a second voltage terminal;
(iv) second resistive means coupled between said node and said first voltage terminal; and
(b) a driver, coupled to said first output terminal, comprising: means for amplifying a voltage and restoring logic levels at said first output terminal.

14. The circuit according to claim 13, said driver further comprising:
a second input terminal coupled to said first output terminal;
a second output terminal;
means for charging a capacitive load coupled to said second output terminal;
a network coupled to said second output terminal, said network having a first state, comprising: means for rapidly discharging a capacitive load; and a second state, comprising: means for dissipating a minimum of power;
means for generating an error voltage between a reference node and said second output terminal in response to voltage changes at said input terminal; and means for switching said network between said first state and said second state in response to said error voltage.

15. The circuit according to claim 14, wherein said means for switching said network between said first state and said second state comprises a third transistor having a collector coupled to said second output terminal, a base, and an emitter, said transistor being operative such that a base-emitter voltage of said transistor is controlled by a difference between a first voltage at said second output terminal and a second voltage at said reference node.

16. The circuit according to claim 14, wherein said second input terminal and said reference node are contained within a first stage; said second output terminal and said means for charging a capacitive load are contained within a second stage; and said means for generating an error voltage, said network, and said means for switching said network are contained in said first stage and said second stage.

17. The circuit according to claim 16, wherein said means for rapidly discharging a capacitive load of said first state of said network comprises:
   a third transistor having a collector coupled to said second output terminal, a base coupled to a current source, and an emitter; and
   a fourth transistor having a collector coupled to said second output terminal, a base coupled to said emitter of said third transistor, and an emitter coupled to said second voltage terminal.

18. The circuit according to claim 13, said driver further comprising:
   a second input terminal coupled to said first output terminal;
   a second output terminal;
   a third output terminal;
   first means for charging a capacitive load coupled to said second output terminal;
   second means for charging a capacitive load coupled to said third output terminal;
   a first network coupled to said second output terminal and a second network coupled to said third output terminal, said first network and said second network each having a first state, comprising: means for rapidly discharging a capacitive load; and a second state, comprising; means for dissipating a minimum of power; and
   means for switching said first network and said second network between said first state and said second state in response to voltage changes at said second input terminal.

19. The circuit according to claim 18, wherein said second input terminal is contained within a first stage; said second output terminal, said third output terminal, said first means for charging a capacitive load, said second means for charging a capacitive load, said first network, and said second network are contained within a second stage; and said means for switching said first network and said second network is contained in said first stage and said second stage.

20. The circuit according to claim 13, said driver further comprising:
   a second input terminal coupled to said first output terminal;
   a pair of second output terminals;
   a first stage, comprising: means for generating a pair of complementary signals in response to a comparison between a voltage at said second input terminal and a reference voltage;
   means responsive to said pair of complementary signals for generating power in a second stage in order to charge and discharge capacitive loads coupled to said pair of second output terminals; and
   means for setting said power in said second stage to any one of a plurality of discrete values within a range of values during fabrication of said driver.

21. A logic circuit, comprising:
   (a) a plurality of logic gates, each of said plurality of logic gates comprising:
      (i) a first plurality of transistors, each of said first plurality of transistors having a drain coupled to a first node, a source coupled to a second node, and a gate coupled to one each of a plurality of input terminals;
      (ii) a first current source coupled between said first node and a first voltage terminal;
      (iii) a second current source coupled between said second node and a second voltage terminal;
      (iv) a first network coupled to said second node comprising: means for inverting the signal at said second node;
      (v) a second network coupled to said first network and a first output terminal comprising: means for discharging and charging a capacitive load coupled to said first output terminal;
   (b) a first logic gate, comprising:
      (i) a second plurality of transistors, each of said second plurality of transistors having a drain coupled a third node, a source coupled to a fourth node, and a gate coupled to one each of said first output terminals from said plurality of logic gates;
      (ii) a third current source coupled between said first voltage terminal and said third node;
      (iii) a fourth current source coupled between said second voltage terminal and said fourth node; and
      (iv) a third network coupled to said fourth node and a second output terminal comprising: means for charging and discharging capacitive loads coupled to said second output terminal.

22. The circuit according to claim 21, wherein said first current source, said second current source, said third current source and said fourth current source comprise:
   a transistor with its gate terminal coupled to its source terminal.

23. The circuit according to claim 21, wherein said third network has means for establishing an upper limit of a voltage at said second output terminal.

24. The circuit according to claim 21, wherein said logic circuit is fabricated in gallium arsenide.

25. A driver circuit, comprising:
   an input terminal;
   an output terminal;
   means for charging a capacitive load coupled to said output terminal;
   a network coupled to said output terminal, said network having a first state, comprising: means for rapidly discharging a capacitive load; and a second state, comprising: means for dissipating a minimum of power;
   means for generating an error voltage between a reference node and said output terminal in response to voltage changes at said input terminal; and means for switching said network between said first state and said second state in response to said error voltage.

26. The circuit according to claim 25, wherein said means for switching said network between said first state and said second state comprises a transistor having a collector coupled to said second output terminal, a base, and an emitter, said transistor being operative such that a base-emitter voltage of said transistor is controlled by a difference between a first voltage at said second output terminal and a second voltage at said reference node.

27. The circuit according to claim 25, wherein said input terminal and said reference node are contained within a first stage; said output terminal and said means for charging a capacitive load are contained within a second stage; and said means for generating an error voltage, said network, and said means for switching said network are contained in said first stage and said second stage.

28. The circuit according to claim 27, wherein said means for rapidly discharging a capacitive load of said first state of said network comprises:
 a first transistor having a collector coupled to said output terminal, a base coupled to a current source, and an emitter; and
 a second transistor having a collector coupled to said output terminal, a base coupled to said emitter of said first transistor, and an emitter coupled to a voltage terminal.

29. A driver circuit, comprising:
 an input terminal;
 a first output terminal;
 a second output terminal;
 first means for charging a capacitive load coupled to said first output terminal;
 second means for charging a capacitive load coupled to said second output terminal;
 a first network coupled to said first output terminal and a second network coupled to said second output terminal, said first network and said second network each having a first state, comprising: means for rapidly discharging a capacitive load; and a second state, comprising: means for dissipating a minimum of power; and
 means for switching said first network and said second network between said first state and said second state in response to voltage changes at said input terminal.

30. The circuit according to claim 29, wherein said input terminal is contained within a first stage; said first output terminal, said second output terminal, said first means for charging a capacitive load, said second means for charging a capacitive load, said first network, and said second network are contained within a second stage; and said means for switching said first network and said second network is contained in said first stage and said second stage.

31. A driver circuit, comprising:
 an input terminal;
 a pair of output terminals;
 a first stage, comprising: means for generating a pair of complementary signals in response to a comparison between a voltage at said input terminal and a reference voltage;
 means responsive to said pair of complementary signals for generating power in a second stage in order to charge and discharge capacitive loads coupled to said pair of output terminals; and
 means for setting said power in said second stage to any one of a plurality of discrete values within a range of values during fabrication of said driver.

32. A driver circuit, comprising:
 an input terminal;
 a pair of output terminals;
 a first stage, comprising: means for generating a first pair of voltages and a second pair of voltages in response to a voltage at said input terminal, and means responsive to a voltage at said input terminal for establishing a lower limit for said first pair of voltages and said second pair of voltages; and
 a second stage, comprising: means for discharging and charging capacitive loads coupled to said pair of output terminals in response to said first pair of voltages and said second pair of voltages.

33. The circuit according to claim 32, wherein said driver circuit is fabricated in gallium arsenide.

34. The circuit according to claim 1, wherein said means for sinking current comprises a resistor.

35. The circuit according to claim 1, wherein said means for sinking current comprises an active current source.

36. The circuit according to claim 35, wherein said active current source comprises:
 a second transistor having a collector coupled to said node, a base coupled to a third voltage terminal, and an emitter; and
 a resistor coupled between said emitter of said second transistor and said second voltage terminal.

* * * * *

UNITED STATES PATENT AND TRADEMARK OFFICE
CERTIFICATE OF CORRECTION

PATENT NO. : 5,182,473
DATED : January 26, 1993
INVENTOR(S) : Jan A. Wikstrom et al It is certified that error appears in the above-indentified patent and that said Letters Patent is hereby corrected as shown below:

Column 7, line 5, delete "a" after the word "to"

Column 8, line 39, ". And," should read --, and--

Column 12, line 53, "baseemitter" should read --base-emitter--

Column 13, line 42, "362 and 361" should read --361 and 362--

Column 14, line 38, "405 and 404" should read --404 and 405--

Column 15, 20, lines 7, 55 respectively, ". And" should read --, and--

Columns 16, 21, lines 23, 64 respectively, ". And," should read --, and--

Column 17, line 38, "508 and 507" should read --507 and 508--

Column 17, line 45, "differentally" should read --differentially--

Column 18, line 22, "pushpull" should read --push--

Column 20, line 30, insert --of-- after the word "any"

Column 21, line 23, "is" should read --in--

Column 26, line 32, insert --to-- after the word "coupled"

Signed and Sealed this

Twenty-fifth Day of January, 1994

Attest:

BRUCE LEHMAN

*Attesting Officer*   *Commissioner of Patents and Trademarks*